United States Patent
Mori et al.

(10) Patent No.: US 9,121,687 B2
(45) Date of Patent: Sep. 1, 2015

(54) PINCH DETECTION DEVICE AT OPENING/CLOSING SECTION, VEHICLE HAVING THE DEVICE, AND METHOD FOR DETECTING PINCH AT THE OPENING/CLOSING SECTION

(75) Inventors: Setsuro Mori, Shiga (JP); Tsuyoshi Eguchi, Saitama (JP); Takanori Yamazaki, Saitama (JP); Toshikazu Karube, Saitama (JP)

(73) Assignees: RIB LABORATORY, INC., Shiga (JP); HONDA MOTOR CO., LTD., Tokyo (JP)

( * ) Notice: Subject to any disclaimer, the term of this patent is extended or adjusted under 35 U.S.C. 154(b) by 122 days.

(21) Appl. No.: 13/808,312

(22) PCT Filed: Dec. 16, 2011

(86) PCT No.: PCT/JP2011/079243
§ 371 (c)(1),
(2), (4) Date: Jan. 4, 2013

(87) PCT Pub. No.: WO2012/086555
PCT Pub. Date: Jun. 28, 2012

(65) Prior Publication Data
US 2013/0106435 A1 May 2, 2013

(30) Foreign Application Priority Data
Dec. 24, 2010 (JP) ................. 2010-287046

(51) Int. Cl.
*G01R 27/28* (2006.01)
*G01B 7/14* (2006.01)
*E05F 15/41* (2015.01)

(52) U.S. Cl.
CPC . *G01B 7/14* (2013.01); *E05F 15/41* (2015.01); *E05Y 2400/54* (2013.01); *E05Y 2400/564* (2013.01); *E05Y 2900/50* (2013.01)

(58) Field of Classification Search
USPC .......................................................... 324/612
See application file for complete search history.

(56) References Cited

U.S. PATENT DOCUMENTS 5,347,361 A * 9/1994 Kay ............................. 356/475
5,350,986 A * 9/1994 Long et al. .................... 318/432
(Continued)

FOREIGN PATENT DOCUMENTS

JP 2003-41856 2/2003
JP 3456389 10/2003
(Continued)

OTHER PUBLICATIONS

International Search Report issued Jan. 24, 2012 in International (PCT) Application No. PCT/JP2011/079243.

*Primary Examiner* — Benjamin M Baldridge
(74) *Attorney, Agent, or Firm* — Wenderoth, Lind & Ponack, L.L.P.

(57) ABSTRACT

A pinch detection device at an opening/closing section has a very simple structure that can surely detect a pinch without faulty operation in a vehicle whose power supply voltage greatly fluctuates. The pinch detection device includes a sensor for detecting displacement of an opening/closing section of a vehicle to be opened/closed by a motor, and a time counter for counting a relative time adjusted according to a fluctuation in a power supply voltage. The pinch detection device also has a pinch detector for detecting a pinch of a foreign matter at the opening/closing section according to a change in a relative speed obtained based on a change in the displacement on a basis of the relative time.

8 Claims, 15 Drawing Sheets

(56) References Cited

U.S. PATENT DOCUMENTS

| | | | |
|---|---|---|---|
| 5,396,158 A * | 3/1995 | Long et al. | 318/282 |
| 6,183,040 B1 * | 2/2001 | Imaizumi et al. | 296/155 |
| 6,297,609 B1 * | 10/2001 | Takahashi et al. | 318/484 |
| 6,614,200 B2 * | 9/2003 | Fowler et al. | 318/445 |
| 7,122,981 B2 * | 10/2006 | Knab et al. | 318/283 |
| 7,307,395 B2 * | 12/2007 | Bouamra et al. | 318/445 |
| 2002/0047678 A1 * | 4/2002 | Wilson | 318/445 |
| 2002/0074959 A1 * | 6/2002 | Van Wiemeersch | 318/445 |
| 2002/0149333 A1 * | 10/2002 | Fowler et al. | 318/445 |
| 2002/0180389 A1 * | 12/2002 | Filgueiras | 318/432 |
| 2003/0007851 A1 * | 1/2003 | Heigl et al. | 414/454 |
| 2003/0111996 A1 * | 6/2003 | Otte | 324/71.1 |
| 2005/0092097 A1 * | 5/2005 | Shank et al. | 73/780 |
| 2005/0225399 A1 * | 10/2005 | Sekimoto | 331/16 |
| 2006/0220604 A1 * | 10/2006 | Hirai | 318/286 |
| 2007/0021082 A1 * | 1/2007 | Okumura et al. | 455/142 |
| 2007/0271848 A1 * | 11/2007 | Wolf et al. | 49/340 |
| 2008/0036406 A1 * | 2/2008 | Kawai et al. | 318/283 |
| 2008/0117992 A1 * | 5/2008 | Murokita et al. | 375/250 |
| 2009/0158857 A1 * | 6/2009 | Shank et al. | 73/780 |
| 2009/0254300 A1 * | 10/2009 | Schneider et al. | 702/145 |
| 2009/0272035 A1 * | 11/2009 | Boisvert et al. | 49/28 |
| 2010/0115853 A1 * | 5/2010 | Gebhart et al. | 49/506 |
| 2011/0096891 A1 * | 4/2011 | Suzuki et al. | 377/1 |

FOREIGN PATENT DOCUMENTS

| | | |
|---|---|---|
| JP | 3621494 | 2/2005 |
| JP | 3663615 | 6/2005 |
| JP | 2007-126960 | 5/2007 |

* cited by examiner

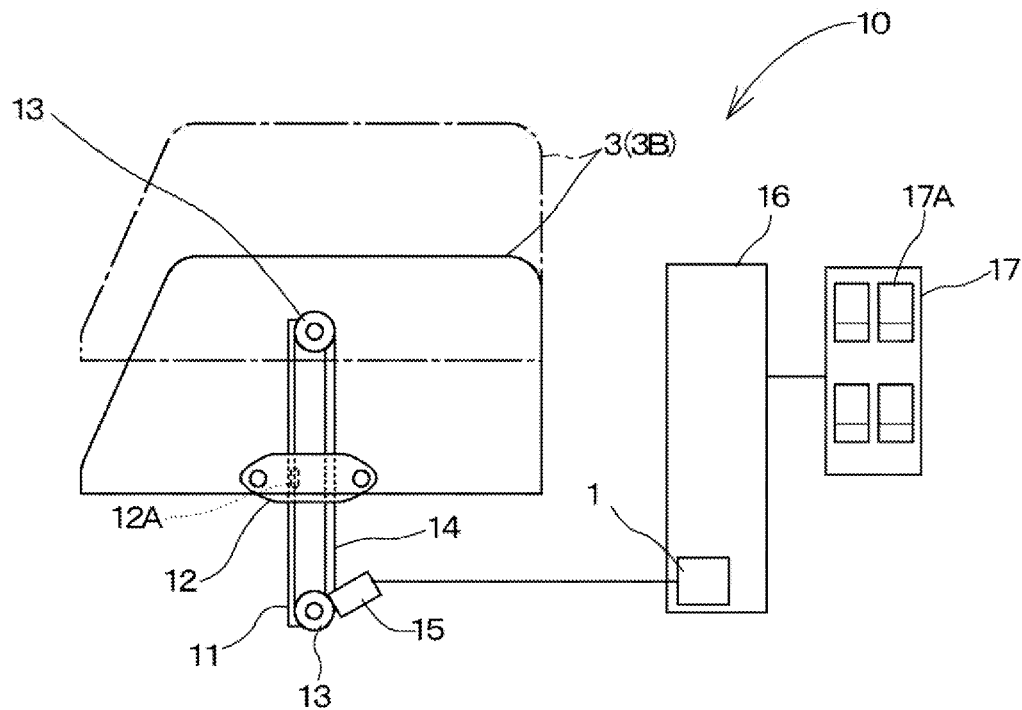
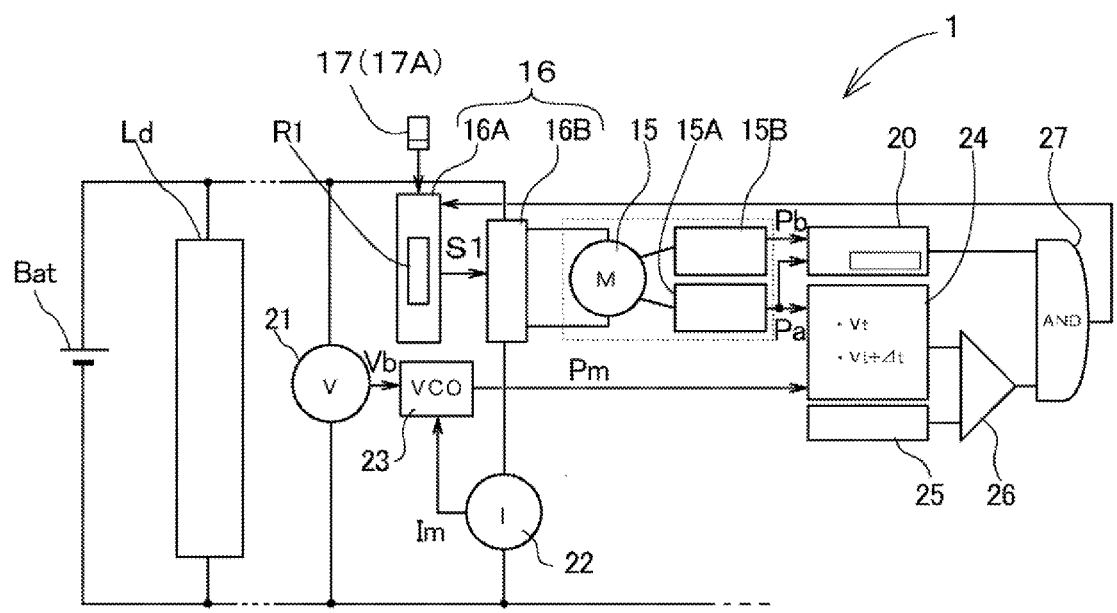

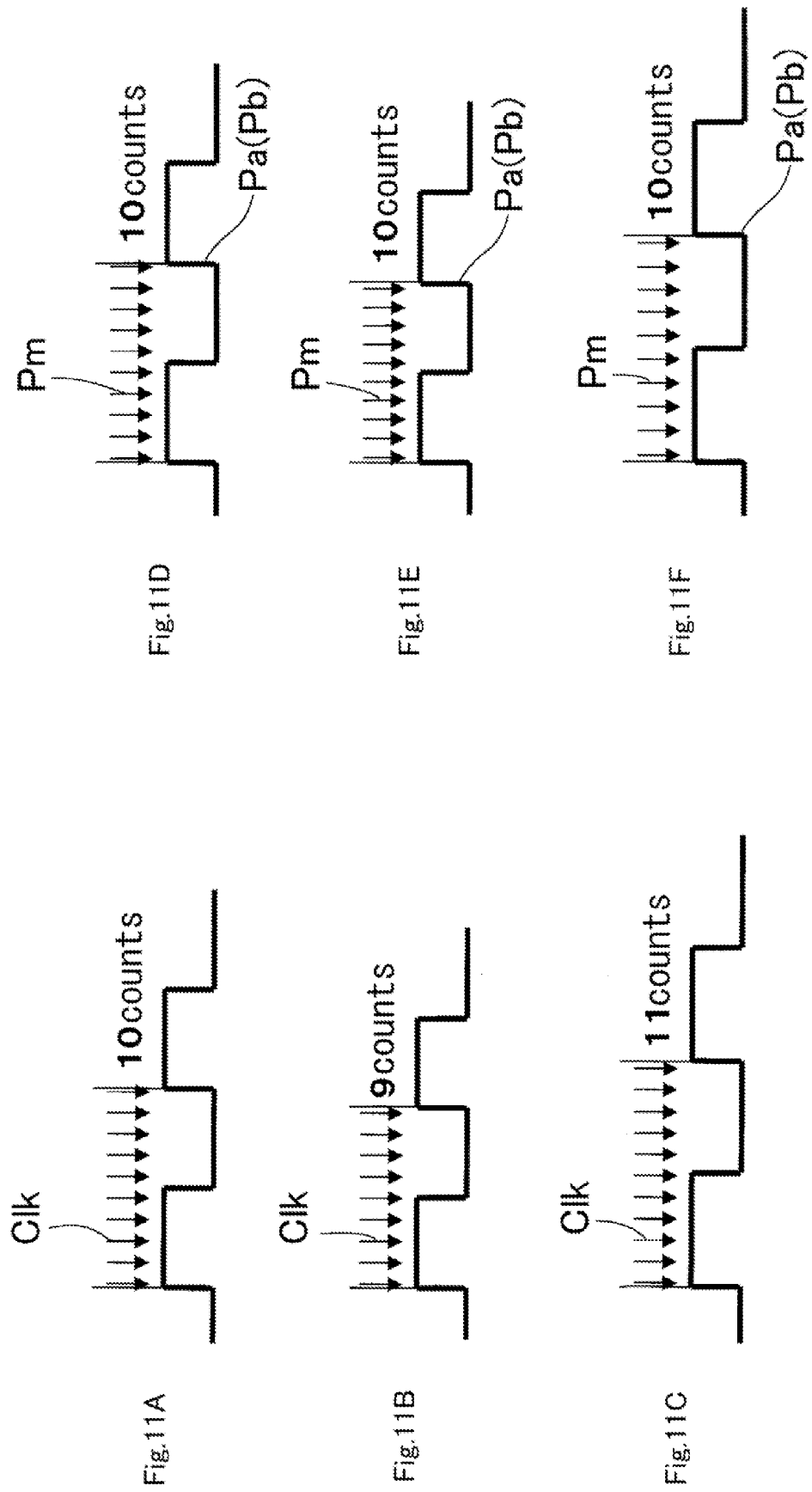

PINCH DETECTION DEVICE AT OPENING/CLOSING SECTION, VEHICLE HAVING THE DEVICE, AND METHOD FOR DETECTING PINCH AT THE OPENING/CLOSING SECTION

TECHNICAL FIELD

The present invention relates to a pinch detection device at an opening-closing section, a vehicle having the device, and the method for detecting pinch at the opening-closing section.

BACKGROUND ART

A power window device is a device capable of opening/closing a window serving as an opening/closing section of vehicles through switch operations. A safety device is devised and made into practical use such that, when human body and the like are pinched at a closing operation of the window, a great force is prevented from being exerted thereto. Japanese Patent Application Laid-Open No. 2007-126960 (Patent Document 1) discloses that a fluctuation amount in motor rotating speed is calculated based on current value and a past value in motor rotating speed and pinch is detected with use of the fluctuation amount.

FIG. 21 is a diagram describing a constitution of a conventional power window device 90. An operation switch 93, a motor drive circuit 94, motors 95 of respective windows, rotary encoders 96, load sensors 97, temperature sensors 98, acceleration sensors 99 are connected to a power window controller 92 connected to a battery 91 of a vehicle.

The power window controller 92 outputs a signal to the motor drive circuit 94 so that power is supplied to the motor 95 provided to the window that is specified by an input through the operation switch 93, and the motor drive circuit 94 supplies power to the motor 95. At this time, the rotary encoder 96 rotates and the power window controller 92 inputs the signal from the rotary encoder 96 therein so that the rotating speed of the motor 95 is obtained. Further, displacement of the windows opened/closed by the motors 95 is calculated, and feedback control is made. In addition, a past rotating speed of the motor 95 stored in advance is compared with a current rotating speed, and in the event of the pinch occurring, danger can be avoided by a reverse rotation of the motor 95, for example.

DISCLOSURE OF INVENTION

Problem to be Solved by the Invention

However, when pinch is detected by using the power window device 90 like Patent Document 1, various sensors such as the load sensors 97, the temperature sensors 98 and the acceleration sensors 99 are mounted to the power window device 90 for secure operations, and these sensors are used for criteria for determination, and the use of the many sensors 97 to 99 causes a problem that the number of parts increases. The more the number of sensors 97 to 99 increases, the more works necessary for mounting the sensors 97 to 99 and adjusting setting positions increase, and thus production cost increases. Particularly when sensors for outputting analog values are used, A/D converters for digitally converting are required for signal processes, but this causes the increase in the cost.

Further, the more the number of the sensors 97 to 99 increase, the more complicated the signal processes that are executed by using the output values from the sensors 97 to 99 are. For this reason, the power window device 90 should execute advanced signal processes using an information processor such as a microcomputer, and thus should prepare programs for executing complicated signal processes and input the programs. Further, the signal processes using the information processor cause not only a temporary delay but also a problem of runaway due to noises, thereby deteriorating reliability of the operation.

In addition, the rotating speed of the motor 95 or the power window device 90 mounted to the vehicle greatly fluctuates according to a fluctuation in power supply voltage, but the windows are mostly simultaneously opened and closed. When the plurality of motors 95 simultaneously operates, a drop of the power supply voltage due to internal resistance of the battery 91 and the like is noticeable, and this occasionally reduces the rotating speeds of the motors 95. Furthermore, in vehicles of recent years, a device such as an electric power steering 91R that requires a large current at a time of the operation increases a load of the battery 91, and since accordingly a voltage fluctuation becomes sharp, a complicated and advanced arithmetic processing should be executed for setting of a threshold so that a faulty operation of pinch is not performed due to a change in the speed according to the fluctuation in the power supply voltage. However, in the case where the arithmetic processing that is too complicated is executed for fear of the faulty operation, it is considered that potentially actual trap cannot be detected.

Further, since the motor 95 for driving the power window device 90 has various characteristics according to its types, the suitable motor 95 should be sorted out at a time of designing the power window device 90. However, since a threshold of the pinch detection should be adjusted or the program of the signal process should be rewritten according to the characteristic of the motor 95, there is a problem that the information processor does not have general versatility, and specifications of the motor 95 cannot be easily changed.

The present invention is devised in view of the above matters, and its object is to provide a pinch detection device at an opening/closing section having a very simple structure that can surely determine trap without a faulty operation also in a vehicle whose power supply voltage greatly fluctuates, a vehicle having this device, and a method for detecting pinch at an opening/closing section.

Means for Solving the Problem

In order to solve the above problem, in accordance with a first aspect of the invention, a pinch detection device at an opening/closing section includes a sensor for detecting displacement of an opening/closing section of a vehicle to be opened/closed by a motor, a time counter for counting a relative time adjusted according to a fluctuation in a power supply voltage, and a pinch detector for detecting pinch of a foreign matter at the opening/closing section according to a change in a relative speed obtained based on a change in the displacement on a basis of the relative time.

As to a battery as a power source of the vehicle, an electrogenic voltage fluctuates due to a charging state as well as its deterioration and its temperature condition, and the fluctuation occurs due to drop of the voltage caused by internal resistance and resistance of an electric wire and the like in a state where a large current flows. However, since the time counter counts a relative time adjusted according to the fluctuation in the power supply voltage, an influence of the decrease in the rotating speed of the motor according to the drop of the power supply voltage can be cancelled based on the relative time. An adjusting amount of the relative time adjusted according to the fluctuation in the power supply voltage can be arbitrarily selected according to the characteristic of the motor.

When the relative time counted by the time counter is set to be shorter than a time for which the opening/closing section moves by a minute displacement detectable by the sensor, a change in the displacement of the basis of the relative time is considered to be obtained by the count number of the relative time counted during detection of a predetermined minute displacement of the opening/closing section, and its inverse number is a relative movement speed of the opening/closing section (in the present specification, this is called a relative speed). On the contrary, when the minute displacement detectable by the sensor is smaller than the displacement of the opening/closing section moving within the relative time, the change in the displacement on the basis of the relative time means the displacement of the opening/closing section within the relative time, and this is considered to be obtained as the relative speed.

That is to say, in the present specification, the relative time means a time axis adjusted according to the power supply voltage so that a change due to a load system is constant, and a speed obtained on the time axis of the relative time is the relative speed. In the following description, also when actually the pinch is detected by using the inverse number of the relative speed obtained from the counted number of the relative time counted during the detection of the minute predetermined displacement of the opening/closing section, it is substantially described that the pinch is detected based on the change in the relative speed (namely, the relative acceleration). The threshold that is used for determining the relative acceleration can be a relative acceleration threshold.

As the relative time is the basis, even when the rotating speed of the motor rotating within the relative time fluctuates according to the voltage fluctuation of the power source and this is caused by the fluctuation in the power supply voltage, the relative speed of the opening/closing section can be always constant. Therefore, since the relative speed of the motor to which the same load is applied does not change in the state where no trap occurs, a definite threshold is unconditionally set so that pinch can be detected based on the change in the relative speed even without executing the complicated arithmetic processing unlike the conventional manners. Thus, when pinch occurs regardless of a level of the power-supply voltage, the pinch can be detected with no effect being exerted on a pinched body. Obviously, when the threshold of the pinch detection on the position of the opening/closing section is ergonomically fluctuated, the setting can be made so that, for example, when the opening/closing section is fully opened, the pinch is imperviously detected, and as the opening/closing section is closer to the full-closed state, the threshold of the trap determination is more strict and more sharp reaction is provided.

It is preferable that a length of the relative time adjusted according to the voltage fluctuation be finely adjusted according to the characteristics of the motors. However, in any DC motors, the more the power supply voltage reduces, the lower the rotating speed is. For this reason, their individual differences are not great, and the length of the relative time may be adjusted approximately linearly with respect to the power supply voltage. An output P from the motor, the relative speed Vt of the movable section and a mass m of the movable section establish a relationship that $P=mVt^2$. When pinch occurs, an impact on a user is considered to be proportional to the output P from the motor. For this reason, it is more preferable that the relative time be adjusted so that a square of the relative speed Vt is constant. In addition, the relative time may be adjusted so that a function of the relative speed Vt adjusted in order to ergonomically making the same level of an impact on a user (for example, an optimum cumulative of the 1st power to the square of the relative speed Vt) is constant. In any manner, the pinch detection device at the opening/closing section of the present invention has general versatility in any motor.

Further, since a lot of various sensors do not have to be provided and complicated signal processes do not have to be executed in order to detect pinch unlike a conventional manner, the production cost of the pinch detecting device at the opening/closing section for detecting pinch accurately can be held down, and also stability of the operation can be secured, thereby improving reliability accordingly. The relative speed calculating process and/or the detecting process for detecting pinch based on the change in the relative speed may be executed by not only hardware including a processing section such as an arithmetic circuit but also software executable by an arithmetic processing section such as a microcomputer. It goes without saying that the above processes may be executed dispersively by a plurality of processing sections connected by communication means.

The opening/closing section in the present specification may be not only glass windows provided to side surfaces of the vehicle but also a roof window and a rear window provided to a roof portion of the vehicle or a slide door provided to the side portion of the vehicle and a tailgate and a gate of luggage room.

The sensor that detects the displacement of the opening/closing section, is, for example, a rotary encoder provided to the motor, thereby making the constitution as simple as possible. For this reason, the production cost can be decreased, but when the sensor is an encoder for directly detecting the displacement of the opening/closing section itself so as to generate a single-phase pulse, or a signal processing circuit for generating a pulse equivalent to that of a pulse encoder using a ripple of a voltage or an electric current to be fed to the motor, or potentiometer such as a linear displacement sensor for outputting an analog signal, a current position can be accurately determined. When the sensor is the potentiometer, it may be combined with an AD converter so as to obtain a digital signal indicating the current position of the opening/closing section.

When the rotary encoder or a rotation angle sensor for detecting a rotation angle of the motor for driving the opening/closing section is used as the sensor, the current position of the opening/closing section can be obtained by integrating measured values of the rotation angle. Further, the obtained position information of the opening/closing section is stored in a nonvolatile memory such as EEP-ROM at a time of power deactivation, and is read again from the nonvolatile memory at a time of power activation, so as to be retained also in the power deactivated state. The nonvolatile memory of the present invention means a memory for retaining storage contents also at the time of power deactivation, and includes a volatile memory (RAM) that is made to be nonvolatile by backup using a secondary power supply such as the battery or a high-capacity capacitor. Further, an integrating circuit for integrating the current positions is backed up by the secondary power supply, so that the position information integrated at the time of power deactivation may be retained.

The time counter is a voltage controlled oscillator for generating a reference pulse with a frequency reduced by a drop in the power supply voltage, and the pinch detector detects pinch when the inverse number of the counted value of the reference pulse counted during the detection of the minute displacement of the opening/closing section via the sensor is used as the relative speed of the opening/closing section and its change is a threshold or more. At this time, the relative time can be counted based on the period of the reference pulse, and this can be used as a measure. The relative time is counted by using the existing voltage controlled oscillator (VCO), so that the circuit can be simplified, miniaturized and stabilized, and its production cost can be reduced.

FIG. 22 is a diagram illustrating a relationship between the power supply voltage and the rotating speed of the motor, a horizontal axis represents the power supply voltage of the battery, and a vertical axis represents a count number of the reference pulse counted during the predetermined minute displacement of opening/closing section and an oscillating frequency of VCO. In FIG. 22, when the oscillating frequency of a reference pulse is fixed as shown by a symbol A, and the power supply voltage is low, a revolution speed of the motor is decreased. For this reason, a time for which the minute displacement of the opening/closing section is detected is lengthened, and the count number of the reference pulse to be counted during this time is large. As the higher the power supply voltage is, the higher the revolution speed of the motor is, and thus the count number of the reference pulse that is counted during the detection of minute displacement of the opening/closing section is reduced. Therefore, the drop in the power supply voltage reduces the oscillating frequency of the reference pulse via VCO as shown by a symbol B, and thus even if the power supply voltage fluctuates, the counting values of the reference pulse of a variable frequency becomes approximately constant as shown by a symbol C, so that the fluctuation in the power supply voltage can be cancelled.

Further, when the relationship that $P=mVt^2$ is taken into consideration, it is more preferable that the relationship shown by the symbol C is adjusted so that the square of the relative speed Vt is constant as shown by a symbol D in order to make the output P from the motor constant. In addition, if an ergonomically appropriate relationship exists, it can be adjusted accordingly so that the function of the relative speed Vt is constant.

The pinch detector has a conditioning circuit for measuring a level of an electric current flowing in the motor and finely adjusting the relative time according to the level of the electric current. In this case, the level of the electric current flowing in the motor is measured by, for example, a current measuring section, and the relative time is adjusted to a direction where the relative speed is heightened according to the level of the electric current. As a result, a correction can be carried out after also the fluctuation in the revolution speed caused by the fluctuation in the electric current flowing in the self motor is taken into consideration.

The sensor that is a pulse generator for generating one-phase pulse based on the rotation of the motor has a closed position detecting switch to detect a closed state and its vicinity of the opening/closing section, and the pinch detector detects pinch only when the current position of the opening/closing section is not near a reference position. In this case, the direction can be determined based on polarity of a feeding voltage to the motor, and integrates the minute displacement of the opening/closing section obtained by the pulse generator provided to the motor so as to obtain the current position of the opening/closing section. Further, the position of the opening/closing section is adjusted to the reference position by the detection of the closed position through the closed position detecting switch, and the current position can be calculated based on the direction determination and the displacement. For this reason, when the current position is near the reference position, a determination is made whether the closed position detecting switch detects pinch on the current position, and only when the current position is not near the reference position, the pinch can be detected.

Since the closed position detecting switch detects that the opening/closing section is at the reference position, it may be a general limit switch without using an expensive Hall IC (a magnetic field detecting switch as one example of a proximity magnetic sensor to which a Hall effect is applied). Obviously, since a limit switch that can detect not a number of pulses but disconnection is necessary for ensuring the reference position (original point), preferably the closed position detecting switch can output a gray code of 2 or more bits. However, the closed position detecting switch may be a linear displacement sensor having an analog element such as a variable resistor that fluctuates according to the position of the opening/closing section near the reference position.

Further, in the case where the constitution is such that when the closed position detecting switch detects that the opening/closing section is in the vicinity of the reference position, pinch is not detected. As a result, since the current position of the opening/closing section does not have to be stored or the current position of the opening/closing section does not have to be calculated by using an output from the encoder, the circuit of the pinch detection device at the opening/closing section is simplified accordingly. In addition, since the position information about the opening/closing section does not have to be inputted from an opening/closing section control unit (ECU or the like), the pinch detection can be locally processed, thereby simplifying wiring.

The pulse generator is a signal processing circuit for extracting a ripple generated in a voltage or an electric current fed to the motor so as to generate a pulse equivalent to a pulse encoder according to the rotation angle of the motor. In this case, when the motor is not provided with the pulse generator such as the rotary encoders or the pulse encoder, the rotation angle of the motor can be detected, and thus the displacement of the opening/closing section can be calculated. For this reason, the production cost can be reduced accordingly. In addition, the pinch detecting device for windows is mounted to existing vehicles that do not detect pinch so as to detect pinch.

The pinch detector is a unit including a power source connecting section which measures a voltage of a circuit power supply and a motor connecting section, and the unit is interposed between an opening/closing operation switch of the opening/closing section and the motor. In this case, this unit can be easily mounted to the existing opening/closing section control unit.

In accordance with a second aspect of the present invention, a vehicle has an opening/closing section control device mounted with the pinch detection device at the opening/closing section of the first aspect of the invention, the control device detecting pinch at a time of closing the opening/closing section, and when detecting the pinch, slightly opening the opening/closing section.

In the vehicle, pinch is detected more definitely and when the pinch occurs, the opening/closing section can be slightly opened. Particularly, also when the opening/closing section operates at a high speed in a state that the power supply voltage of the battery mounted to the vehicle is high, a shock delivered to a body at a time of the occurrence of pinch can be repressed constantly. For this reason, excellent safety is provided. Obviously, the device can be set so that ergonomically the threshold of the pinch detection is fluctuated with respect to the position of the opening/closing section, and pinch is imperviously detected, for example, in the state that the opening/closing section is fully opened, and as at the state is closer to the full-opened state, the threshold of the pinch detection is more strict and more sharp reaction is provided.

In accordance with a third aspect of the present invention, a pinch detecting method for detecting pinch at an opening/closing section of a vehicle opened/closed by rotation of a motor, the method includes detecting a displacement according to movement of the opening/closing section, obtaining a change in a relative speed based on the displacement using a relative time adjusted so as to be long according to a power supply voltage through a calculator as a measure, and comparing the change in the relative speed with an acceleration threshold so as to detect pinch of a foreign matter.

Since the change in the relative speed is obtained by the calculator using the relative time adjusted according to the power supply voltage as a measure, even if the revolution speed of the motor fluctuates due to the fluctuation in the power supply voltage, the speed obtained by using the relative time as measure can be relatively constant. Therefore the acceleration threshold for the pinch detection is strictly set for the relative speed, so that the pinch detection can be made more surely. In the DC motor, since $P=mVt^2$ where an output from the motor is represented by P, the relative speed of the movable portion is represented by Vt and a mass of the movable portion is represented by m, an influence of the voltage fluctuation occurs according to this quadratic function. However, since the speed is influenced approximately uniformly and linearly, the relative time is set to be longer at a predetermined rate with respect to the voltage fluctuation, so that the influence of the voltage fluctuation can be eliminated.

The arithmetic of the change in the relative acceleration and the comparison with the acceleration threshold can be carried out easily by using a calculator or a comparator. When pinch is detected by the pinch detection, it is considered that the motor is reversely rotated to a direction where the opening/closing section is slightly opened.

An oscillation signal with low frequency is generated according to a reduction in the power supply voltage by a voltage controlled oscillator, a relative time is counted at a period of the oscillation signal, and the relative acceleration is obtained based on an inverse number of the number of the oscillation signal counted while the opening/closing section is shifting due to a predetermined minute displacement. In this case, since the oscillation signal with low frequency due to the drop of the power supply voltage can be obtained by the existing voltage controlled oscillator (VCO), the relative time can be surely obtained by a period of the oscillation signal (or its constant factor).

When the relative time is finely adjusted so as to be long according to an increase in an electric current flowing in a motor, the relative time can be corrected after the minute fluctuation caused by the electric current flowing in the motor is taken into consideration.

A closed state of the opening/closing section is detected by a gray code of a closed position detecting switch, the position of the opening/closing section is adjusted to a reference position by the detection of the closed position, a current position of the opening/closing section is calculated by a direction determination based the polarity of the voltage fed to the motor and the count number of pulses generated according to rotation of a decoder provided to the motor, and only when the current position is not in a vicinity of the reference position, the pinch detection is made. In this case, only the closed position detecting switch is provided and an expensive magnetic sensor or the like is not required, thereby reducing the production cost. Since the pinch detection at the opening/closing section can be made accurately by a more simple method, the current position of the opening/closing section does not have to be communicated with the opening/closing section control unit (ECU and the like), thereby executing a local process.

Effect of the Invention

As described above, according to the present invention, when the revolution speed of the motor for opening/closing the opening/closing section of the vehicle increases/decreases due to the fluctuation in the power supply voltage of the battery mounted to the vehicle, the change in the displacement (the relative speed) of the opening/closing section on the basis of the relative time adjusted according to the voltage fluctuation is not influenced by the voltage fluctuation. Pinch of a foreign matter can be detected surely by the change in the relative speed.

That is to say, when the plurality of opening/closing sections are simultaneously opened and closed or a load that requires a large electric current for electric power steering is applied, even if the opening/closing speeds of the opening/closing sections reduce, pinch can be surely detected without a faulty operation.

BRIEF DESCRIPTION OF DRAWINGS

FIG. 1(A) is a side view, and FIG. 1(B) is a plan view.

FIG. 2 is a diagram illustrating an opening/closing section control device to which the pinch detection device at the opening/closing section according to a first embodiment is mounted.

FIG. 3 is a diagram illustrating the pinch detection device at the opening/closing section and a pinch detecting method in the opening/closing section.

FIGS. 11(A) to 11(F) are diagrams describing that the operation of the pinch detection device at the opening/closing section is compared with a conventional method, and FIGS. 11(A) to 11(C) are diagrams illustrating a speed detecting method in a conventional system, and FIGS. 11(D) to 11(F) are diagrams illustrating a relative speed detecting method of the present invention.

BEST MODE FOR CARRYING OUT THE INVENTION

Figure 1A:
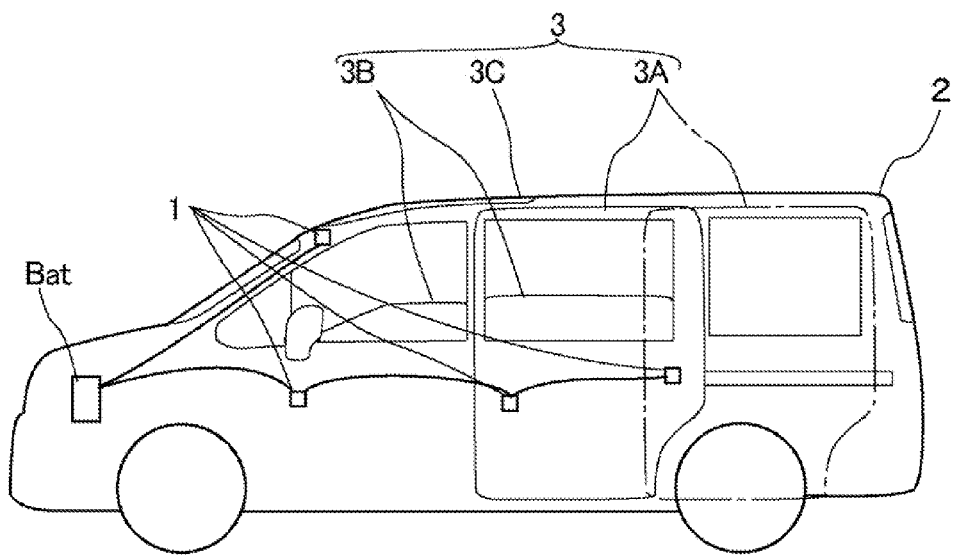
FIGS. 1(A) and 1(B) are diagrams illustrating a vehicle to which a pinch detection device at an opening/closing section of the present invention is mounted.
Figure 1B:
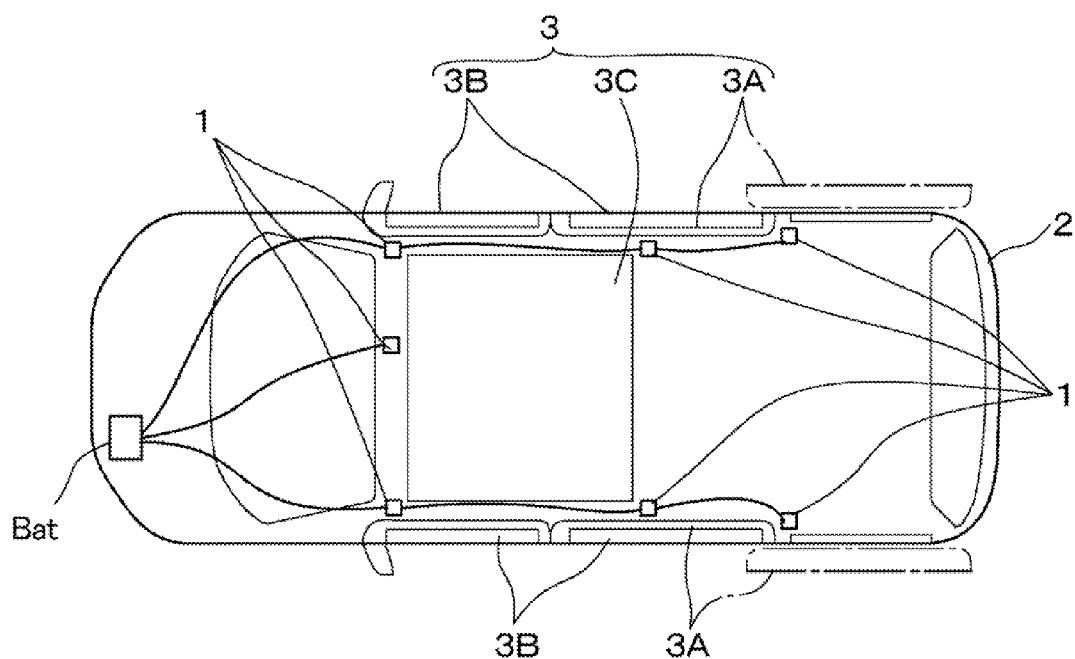

A pinch detection device 1 at an opening/closing section, a vehicle 2 having the device, and the pinch detecting method for an opening/closing section according to a first embodiment of the present invention will be described below with reference to FIG. 1(A) to FIG. 8. FIGS. 1(A) and 1(B) illustrate the vehicle 2 to which the pinch detection device 1 at the opening/closing section of the present invention is mounted.

As shown in FIGS. 1(A) and 1(B), the vehicle 2 is provided with slide doors 3A on both side surfaces of a rear part, respectively, and is provided with windows 3B on a front driver's seat door and a front passenger's seat door and on the rear right and left side slide doors 3A, respectively, and an openable/closable roof window 3C on a roof. Further, the slide doors 3A can be displaced to a right-left direction, the windows 3B can be displaced to an up-down direction, and the roof window 3C can be displaced to a front-rear direction. They are embodiments of the opening/closing section 3 of the present invention. Bat represents a battery of the vehicle, and all electric loads are connected to the battery Bat. Further, the pinch detection device 1 at the opening/closing section according to the present embodiment is installed in each of ECUs (Electronic Control Units) for controlling the slide doors, the power windows, a sliding roof (opening/closing control of the sliding roof windows), a power tail gate (opening/closing control of a tail gate), and a power luggage (opening/closing control of a luggage room).

When a state where a fellow passenger's body is pinched in the opening/closing section 3 and the like occurs, the ECU having the pinch detection device 1 at the opening/closing section of the present invention instantly determines the pinch and drives the opening/closing section 3 slightly to an open direction so as to release the pinch. Particularly, when an electrogenic voltage of the battery Bat fluctuates due to its charging amount, and a large electric current flows in another electric load, the power supply voltage greatly fluctuates due to resistance loss of internal resistance of the battery Bat and electric wires and the like, and the power supply voltage is about 8 to 15 V. For this reason, when these opening/closing sections 3 are simultaneously opened/closed, their operation speeds are noticeably reduced in some cases. However, the ECU having the device 1 for detecting pinch at the opening/closing section of the present invention is not influenced by the reduction in the operation speeds of the opening/closing sections 3 due to the fluctuation in the power supply voltage so as to accurately detect the pinch.

Therefore, even if a user's body is mistakenly pinched in the opening/closing section 3, the vehicle 2 provided with the pinch detection device 1 for windows according to the present embodiment detects the pinch with less impact, and thus the user can securely use the vehicle 2 at ease. (Note that: the detailed constitution of the pinch detection device 1 at the opening/closing section and details of the pinch detecting method in the opening/closing section will be described later.)

FIG. 2 is a diagram illustrating a constitution of a power window device 10 for controlling opening/closing of the windows 3B as one example of the opening/closing section control device to which the pinch detection device 1 at the opening/closing section is mounted. As the power window device 10, various constitutions are considered. The power window device 10 includes, in the present embodiment, a guide rail 11 fixed to the door with its lengthwise direction being vertical, a sliding body 12 that is movable to an up-down direction along the guide rail 11 and supports lower ends of the windows 3B, a wire 14 that is wound around pulleys 13 arranged above and below the guide rail 11 and is partially connected to a connecting section 12A of the sliding body 12, the motor 15 for rotationally moving the wire 14 so as to supply power for opening/closing the windows 3B, an ECU 16 having a power window control function for supplying electric power to the motor 15 so as to rotate the motor 15 regularly and reversely to thereby open/close the windows 3B, and opening/closing operation switch 17 capable of inputting an opening/closing operation by the user. The pinch detection device 1 at the opening/closing section of the present invention may operate independently from the ECU 16 having the power window control function, and in this case, the ECU 16 can be omitted.

The opening/closing operation switch 17 has four buttons 17A corresponding to the windows 3B on the front, rear, right and left sides. That is to say, illustration is omitted for simplifying the drawing, but respective members 11 to 15 and the devices 1 for determining trap at the opening/closing section are formed for the four windows 3B so that the buttons 17A can individually operate the windows 3B. For this reason, when an operator simultaneously operates all the buttons 17A, all the motors 15 or the windows 3B are turned together, and thus a load put on the battery Bat increases. For this reason, the power supply voltage drops, and the rotating speeds of the motors 15 become slow.

FIG. 3 is a diagram describing the constitution of the pinch detection device 1 at the opening/closing section according to the present embodiment, and the pinch detecting method at the opening/closing section. The motor 15 is provided with rotary encoders 15A and 15B as one example of the sensor for generating an A-phase pulse Pa and a B-phase pulse Pb whose phases are different by 90° due to its rotation and outputting a 2-bit gray code so as to detect the displacement of the windows 3B.

20 represents a direction/position detector for detecting a rotating direction and a rotation angle through these pulses Pa and Pb and detecting a position of the window 3B through integration. 21 represents a voltage measuring section for measuring the power supply voltage Vb. 22 represents a current measuring section for measuring a motor current Im flowing in the motor. 23 represents a voltage controlled oscillator (one example of the time counter. Hereinafter, referred to as VCO) for oscillating a reference pulse Pm (a period of this pulse is a relative time for calculating the relative speed) with a frequency reduced due to the reduction in the power supply voltage Vb. 24 represents a relative acceleration calculator for counting a period for which the window 3B minutely displaces through a rise of the A-phase pulse Pa to count the number of the reference pulses Pm during this period, and using an inverse number of the counted value as the relative speed Vt of the window 3B so as to calculate the relative acceleration based on a change in the relative speed within micro time Δt. 25 represents a relative acceleration threshold setting section for setting a threshold of the relative acceleration. 26 represents a comparator for comparing the relative acceleration with the acceleration threshold so as to detect pinch. 27 represents a logical operation section for outputting a pinch detected signal Out when the comparator determines that pinch occurs and the direction/position detector 20 determines that the window 3B is not immediately before closing in the closing direction.

Therefore, in the present embodiment, the comparator 26 and the logical operation section 27 are the pinch detectors for detecting pinch of foreign matters. The ECU 16 is provided with a processor 16A for outputting an open/close signal S1 to the window 3B according to an operation of the button 17A, and a driver 16B for supplying electric power to the motor 15 in a direction where control is made by the open/close signal S1. The processor 16A is provided with a reverse controller R1 (in the present embodiment, this is realized by executing a reverse processing program via the processor 16A, and driving the window 3B to the opened direction for a few hundred msec. to several sec. after the determined signal Out is inputted) for slightly reversing the rotating direction of the motor 15 so as to release the pinch state when the logical operation section 27 outputs the pinch detected signal Out.

Figure 4:
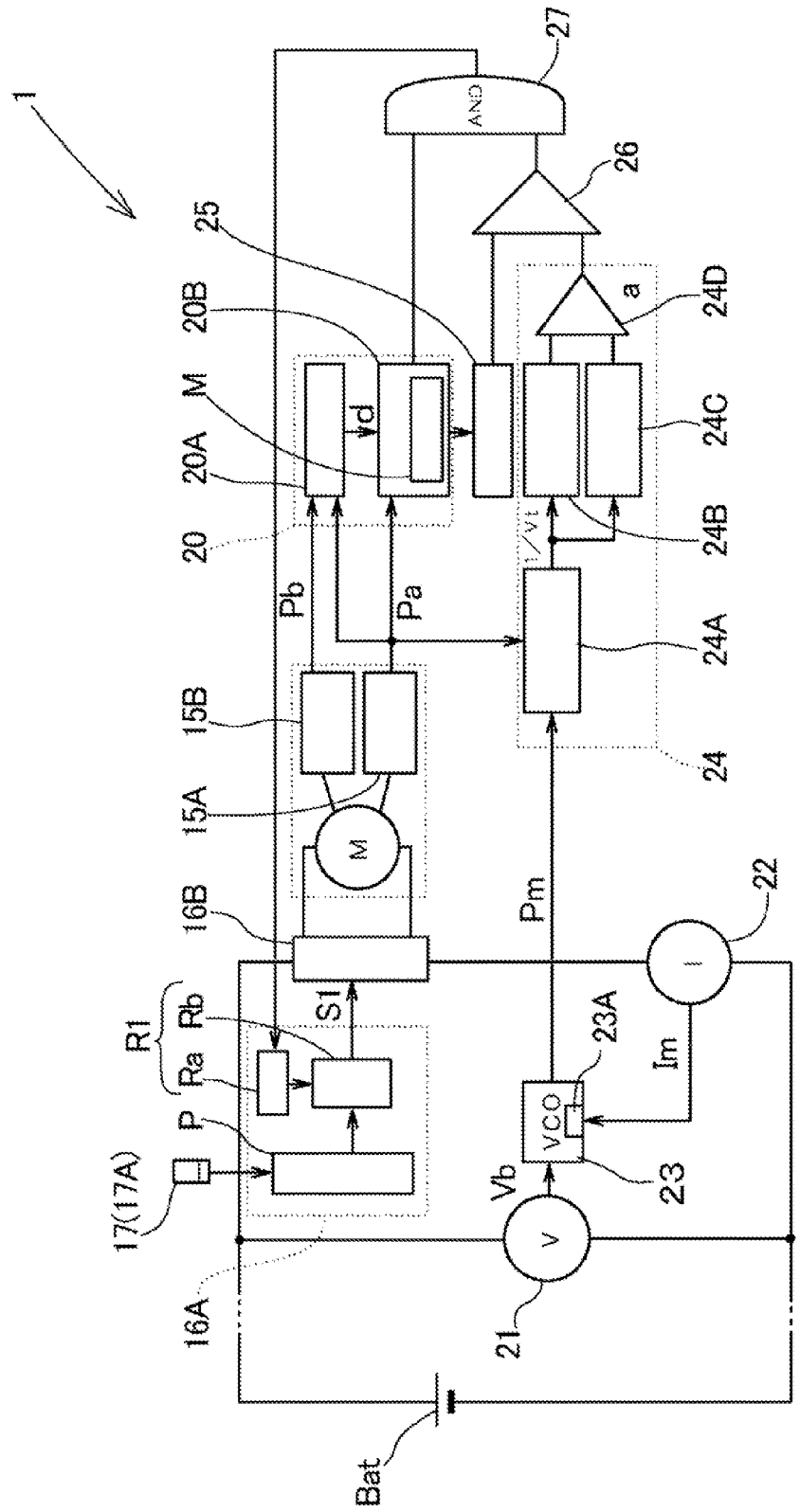
FIG. 4 is a diagram illustrating a more detailed constitution of the pinch detection device at the opening/closing section.

FIG. 4 is a diagram describing a further detailed constitution of the pinch detection device 1 at the opening/closing section. As shown in FIG. 4, the processor 16A is provided with a window controller P for generating a control signal to the opening/closing section according to an operation of the buttons 17A, a timer Ra for counting time of a few hundred msec. to a several sec. after the pinch detected signal Out is inputted, and a reverse section Rb for driving the window 3B to the opened direction while the timer Ra counts the time.

The direction/position detector 20 has a direction determinator 20A for determining a rotating direction d of the motor 15 using a phase difference between the pulses Pa and Pb, and a current position detector 20B for integrating the value obtained by counting the pulse Pa in regular and reverse directions shown by the rotating direction d so as to detect a current position L of the opening/closing section 3B. Further, the current position detector 20B has a nonvolatile memory M for backing up the current position (position information) of the opening/closing section 3B being counted at a time when the power supply to the pinch detection device 1 at the opening/closing section is stopped, and recovering the position information using a backup 8 at a time when the power supply is restarted. Further, the VCO 23 has a conditioning circuit 23A for finely adjusting a period (relative time) of the reference pulse Pm according to the level of the electric current Im measured by the current measuring section 22.

The relative acceleration calculator 24 has a counter 24A for counting the reference pulse Pm at every period of the pulse Pa so as to obtain an inverse number (1/Vt) of the relative speed Vt, a first movement average arithmetic unit 24B for calculating a movement average of the outputs (1/Vt) from the counter 24A, a second movement average arithmetic unit 24C for calculating a movement average Δt seconds before, and a subtractor 24D for calculating a difference of the movement averages with time difference Δt so as to obtain a change in the inverse number (1/Vt) of the relative speed Vt for Δt seconds (in the specification below, this is the relative acceleration a). The movement average arithmetic units 24B and 24C first convert the outputs (1/Vt) from the counter 24B into the relative speeds Vt and then may obtain a movement average. That is to say, the relative acceleration a can be a change in the relative speed Vt within the micro time Δt whether or not it is an inverse number.

Further, the relative acceleration threshold setting section 25 adjusts a threshold according to the position information L. That is to say, the threshold of the relative acceleration is adjusted so that the pinch detection is made imperviously when the window 3B are close to the fully opened state, and the threshold of the relative acceleration is adjusted so that as the window 3B is closer to the fully opened state, the pinch detection is made sharply. As a result, when a user's arm or face is pinched when the window 3B is being closed, the pinch can be quickly detected only by a change in the speed that does not make an impact on the user, and when the window 3B is close to the fully opened state, occurrence of slight resistance can be prevented from being detected as pinch.

Figure 22:
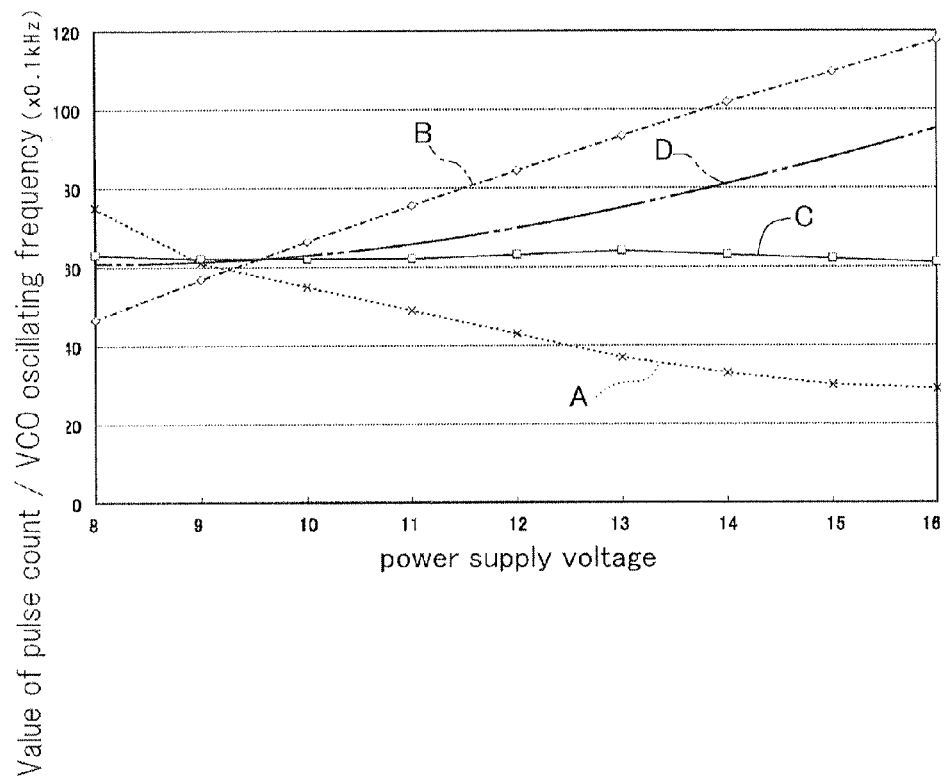
FIG. 22 is a diagram illustrating a relationship between the power supply voltage and a rotating speed of the motor.

As described in the present embodiment, the reference pulse Pm is outputted with the aid of the VCO 23 by using a measured value of the power supply voltage Vb, and the relative time indicated by one period of the reference pulse Pm is used as a measure so as to obtain the relative acceleration based on the displacement of the window 3B. Provision of such a very simple circuit can make the relative speed stable without being influenced by the fluctuation in the power supply voltage Vb as shown by a reference symbol C in FIG. 22. Therefore, the change in the relative speed, namely, the relative acceleration is used to detect pinch of foreign matters, so that the pinch can be accurately detected. That is to say, since a plurality of electric loads Ld is connected to the battery Bat, when a large current flows in the electric loads Ld, the power supply voltage Vb drops, but this does not influence the pinch detection.

Figure 5:
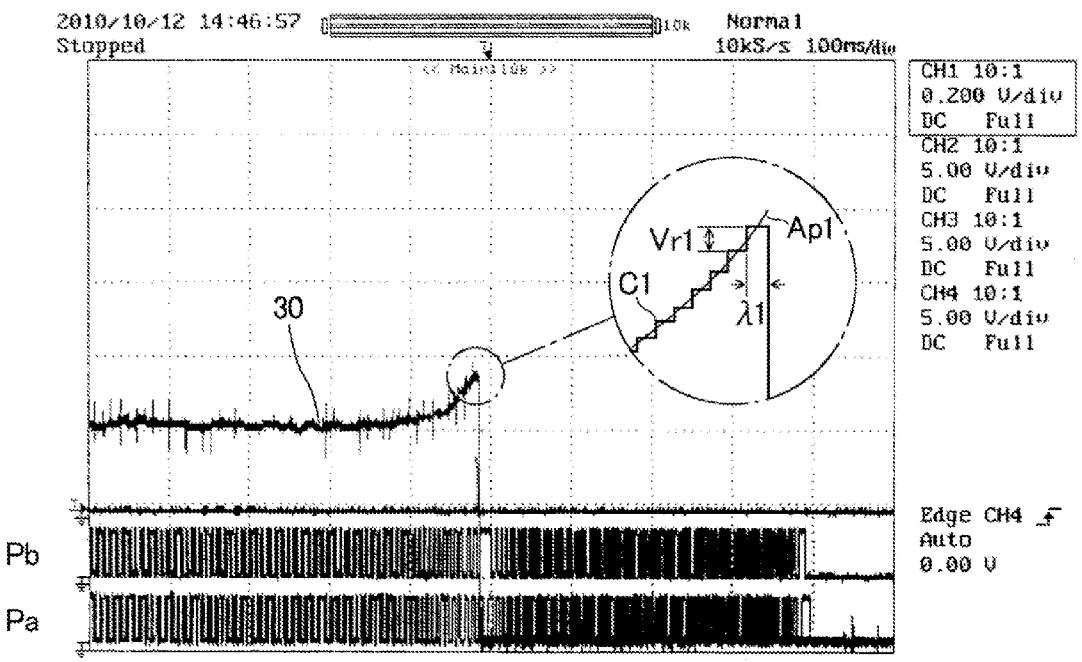
FIG. 5 is a diagram describing an operation in a state that a power supply voltage is high.
Figure 6:
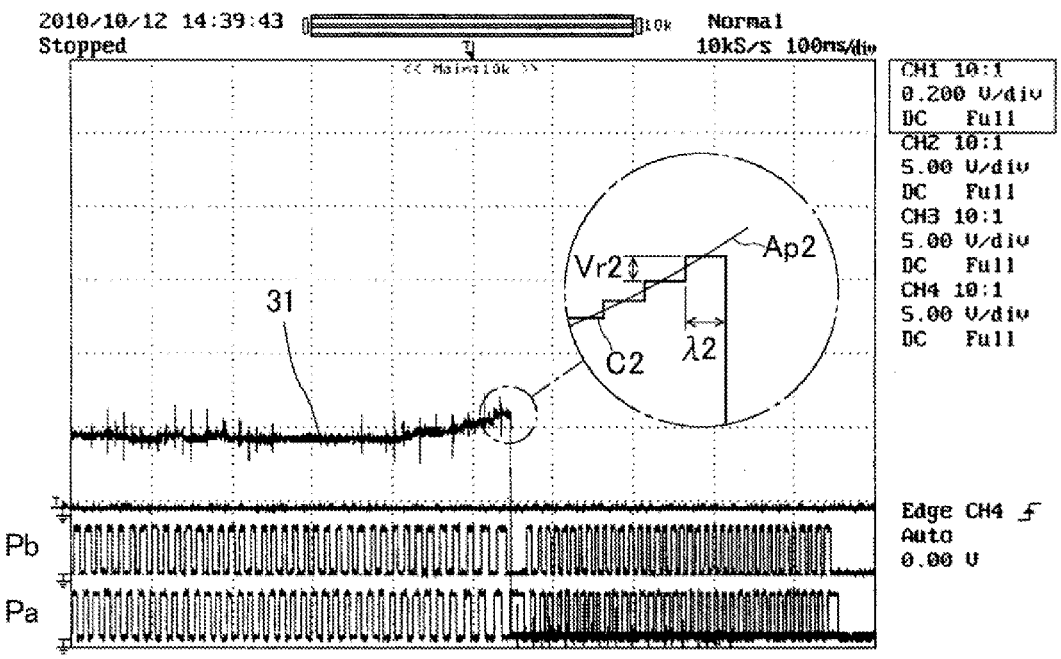
FIG. 6 is a diagram describing an operation in a state that the power supply voltage is low.

FIG. 5 is a diagram illustrating an example of signals in each of the sections in the case where the motor 15 rotates at a high speed when the power supply voltage Vb is 15 V. FIG. 6 is a diagram illustrating an example of the signals in each of the respective sections in the case where the motor 15 rotates at a low speed when the power supply voltage Vb is 10 V. In FIG. 5 and FIG. 6, graphs shown by symbols 30 and 31 are values obtained by counting the number of the reference pulse Pm during the micro time counted by one period of the A-phase pulse Pa, and this value means the inverse number (1/Vt) of the relative speed Vt. Further, λ1 and λ2 represent one period of the pulse Pa, and C1 and C2 represent counted values of the reference pulse Pm counted during one period λ1 and one period λ2. Ap1 and Ap2 represent fitted curves for smoothing the counted values C1 and C2, and Vr1 and Vr2 represent differences in the counted values (reverse numbers of the relative speeds 1/Vt, 1/(Vt−Δt)) C1 and C2 at one period of the pulse Pa.

As shown in FIG. 5 and FIG. 6, tilts of the fitted curves Ap1 and Ap2 are seemed to be different, but the difference Vr1 and Vr2 between the period λ1 and the period λ2 of the pulse Pa are approximately the same as each other, and they as the relative accelerations are compared with the relative acceleration threshold so as to be used. That is to say, the counted values C1 and C2 obtained on a basis of one period (relative time) of the reference pulse Pm with frequency adjusted according to the fluctuation in the power supply voltage Vb use the relative time as a so-called measure. For this reason, even if a width of the pulse Pa fluctuates due to the fluctuation in the power supply voltage Vb, the differences Vr1 and Vr2 can be approximately constant. Thus, the relative acceleration obtained based on the relative speed Vt is compared with the relative acceleration threshold and pinch is detected so that a certain impact caused by the pinch can be detected regardless of the rotating speed of the motor 15.

Since each of the members 20 to 27 can be easily formed by simple hardware, the production cost can be reduced, and also the signal processing can be instantly executed. Further, the operation of the pinch detection device 1 at the opening/closing section can be stabilized without being influenced by noises or the like. However, each of the sections 20 to 27 may be implemented by programs executable by an arithmetic processing unit in the ECU 16 for controlling the power window.

Figure 7:
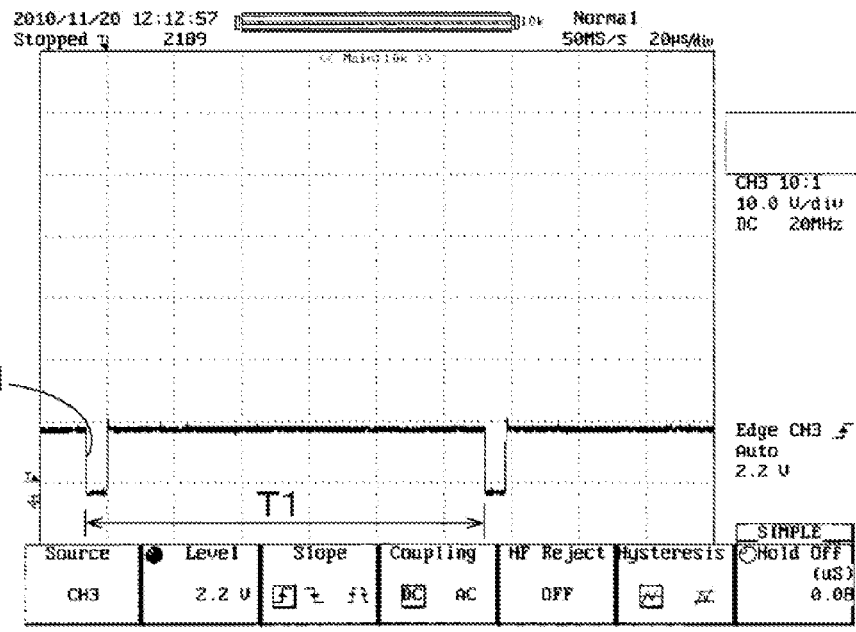
FIG. 7 is a diagram illustrating a reference pulse in the case where an electric current is not corrected.
Figure 8:
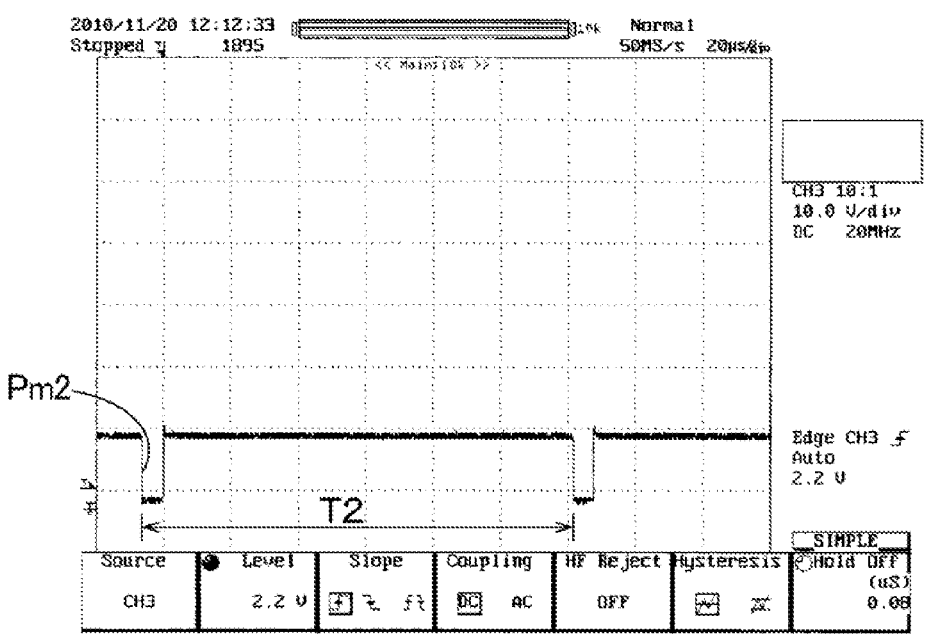
FIG. 8 is a diagram illustrating a reference pulse in the case where an electric current is corrected.

FIG. 7 and FIG. 8 are diagrams illustrating examples of a wavelength (relative time) of the reference pulse Pm to be adjusted according to the level of the electric current Im flowing in the motor 15. Pm1 in FIG. 7 and FIG. 8 represent an output pulse of the VCO 23 in the case where the conditioning circuit 23A by the electric current Im flowing in the motor 15 is not present (when the electric current Im=0), and Pm2 represents an output pulse of the VCO 23 in the case where the conditioning circuit 23A by the electric current Im flowing in the motor 15 is provided. T1 represents the relative time including one period of the output pulse Pm1, and T2 represents the relative time including one period of the output pulse Pm2. When the output pulses Pm1 and Pm2 are compared, T2>T1, and as the electric current Im is larger, the relative times T1 and T2 can be adjusted closer to a direction where the relative speed is heightened. For this reason, even if the revolution speed fluctuates due to the electric current Im flowing in the self motor 15, the fluctuation can be corrected.

Figure 9:
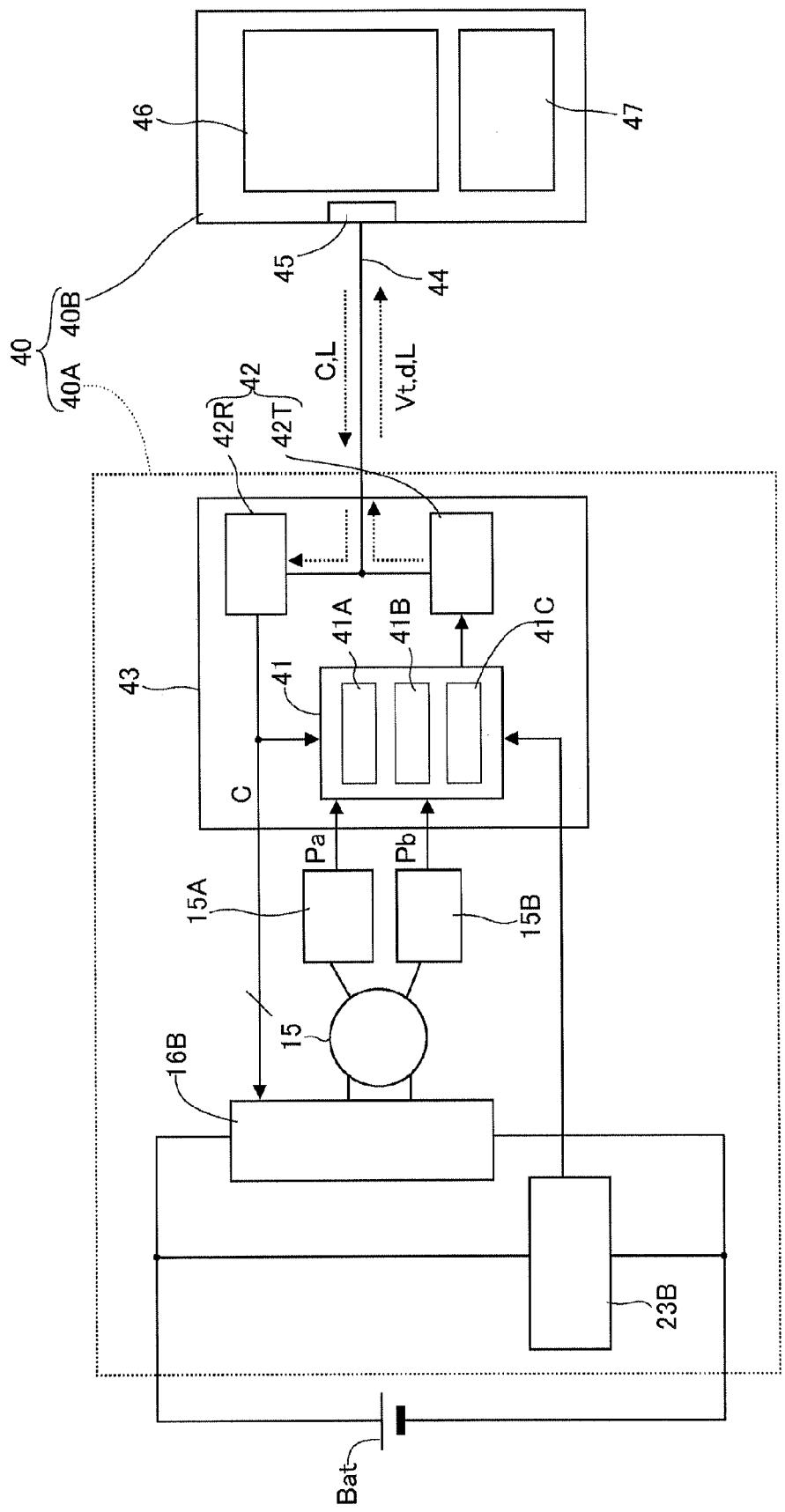
FIG. 9 is a diagram illustrating a constitution of the pinch detection device at the opening/closing section according to a second embodiment.

FIG. 9 is a diagram illustrating a constitution of the pinch detection device 40 at the opening/closing section according to a second embodiment. FIGS. 10(A) to 11(F) are diagrams describing an operation of the pinch detecting device 40. In FIGS. 9 to 11(F), since the portions denoted by the same reference numerals in FIGS. 1 to 8 are the same or equivalent members, detailed description thereof is omitted.

In a background of the second embodiment, since a pinch detection in the opening/closing section of a conventional vehicle is made by a dedicated microcomputer mounted in a very close position of the motor 15, the dedicated microcomputer for pinch detection should be mounted to all the opening/closing sections 3. There is a problem that the same number of dedicated microcomputers as the number of the opening/closing sections 3 is required, and accordingly the cost increases.

Therefore, when pinch detection control in each of the opening/closing sections 3 are collectively controlled by a vehicle body control ECU in a concentrated manner, a motor detection pulse necessary for control or the power supply voltage at the position very close to the motor 15 should be loaded into the vehicle body control ECU by connection through a harness. For this reason, there is a problem that, when the motor 15 is separated from the vehicle body control ECU, faulty pulse detection and an error between an actual voltage value and a read A/D converted value are caused due to influences of wiring impedance and external noises, and also the number of vehicle body harnesses increases.

Further, there considered a method of mounting inexpensive communication logic ICs to the opening/closing sections 3, respectively, and transmitting, to the vehicle body control ECU via serial communication, a detection pulse by the motor 15 necessary for control and the power supply voltage at the position very close to the motor 15. However, since A/D converter is not generally mounted to an inexpensive logic IC, an external A/D converter and interface are necessary, and thus a components cost rises, thereby deteriorating the effect of the reduction in the cost produced by eliminating of the microcomputer. Further, when the nonvolatile memory is mounted to a logic IC in order to back up the current position at the power-off time, the cost further rises.

That is to say, the second embodiment is carried out by paying an attention to such conventional problems, and its object is to provide an opening/closing section control device where detection of pinch in at the opening/closing sections 3 of the vehicle is controlled collectively by the vehicle body control ECU, and the inexpensive communication logic IC is mounted instead of unnecessary dedicated microcomputers for the opening/closing sections 3, and thus an A/D converter is not necessary.

In the second embodiment shown in FIG. 9, the pinch detection device 40 at the opening/closing section has an opening/closing section control unit 40A arranged at the position very close to each of the motors 15 arranged in each of the opening/closing sections 3 of the vehicle 2, and the vehicle body control ECU 40B that is connected to the opening/closing section control unit 40A and collectively controls the pinch detection in a concentrated manner.

The sensors 15A and 15B are rotation detecting means (rotary encoders) for outputting pulses synchronized with the rotation of the motor 15, and the time counter 23B is a voltage-frequency converting means (VCO) for outputting the reference pulse Pm generated by converting the fluctuation in the power supply voltage at the position very close to the motor 15 into a relative change of frequency.

The opening/closing section control unit 40A has one-chip logic IC 43 provided with a calculator 41 and a sensor-side communication section 42. The calculator 41 is provided with a speed detector 41A for calculating the relative speed Vt of the opening/closing section 3 based on the output pulses Pa and Pb from the rotary encoders 15A and 15B using the reference pulse Pm as a count clock, a moving direction detector 41B for determining the moving direction (the rotating direction of the motor) d based on the output pulses Pa and Pb, and the current position detector 41C for obtaining the current position L using the output pulses Pa and Pb.

Further, the sensor-side communication section 42 is for carrying out the direct current power line carrier communication (DC-PLC: Power Line Communication), and is provided with a transmitting section 42T for superimposing the information Vt, d and L on the power line 44 of the logic IC 43, and a receiving section 42R for receiving control signals C and L to be superimposed on the power line 44. That is to say, in the present embodiment, the power line 44 functions as a communication line.

On the other hand, the vehicle body control ECU 40B is provided with a control-side communication section 45 that can receive the relative speed Vt with it being connected with the sensor-side communication section 42 and the communication line 44, and a pinch detector 46 for detecting pinch based on the change in the received relative speed Vt. Further, 47 represents a current position saving section (the nonvolatile memory) for storing the current position L of the opening/closing section 3 received via the control-side communication section 45, and thereby performing back up.

Figure 10B:
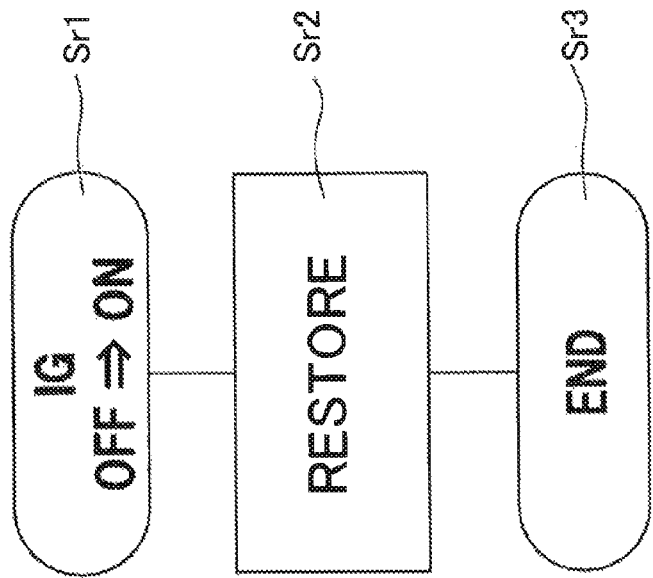
FIGS. 10(A) and 10(B) are diagrams describing an operation of the pinch detection device at the opening/closing section, and FIG. 10(A) describes a backup operation, and FIG. 10(B) describes a restore operation.
Figure 10A:
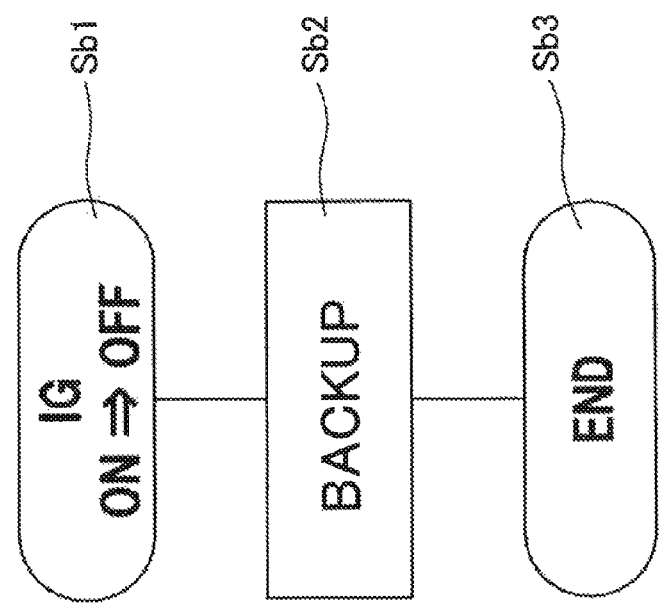

FIGS. 10(A) and 10(B) are diagrams describing an operation of the pinch detection device 40 at the opening/closing section according to the present embodiment. As shown in FIG. 10(A), activation is carried out by ignition-off as a trigger (step Sb1), and the current position detector 41C transmits the current position L via the sensor-side communication section 42 and the back-up operation for storing the current position L received by the control-side communication section 45 in the nonvolatile memory 47 is performed (step Sb2). When the back-up operation is ended (step Sb3), the current position L can be backed up in the nonvolatile memory 47 during the ignition-off.

It is preferable that the current position detector 41C always transmit the current position L, and in this case, the back-up operation in step Sb2 allows the current position L always received to be saved according to the ignition-off. Further, the current position L is backed up by the nonvolatile memory 47, not shown, but the nonvolatile memory 47 may be a volatile memory that is always energized.

As shown in FIG. 10(B), activation is carried out by ignition-on as a trigger (step Sr1), and the current position L stored in the nonvolatile memory is transmitted via the control-side communication section 45. The current position L received by the sensor-side communication section 42 is restored by the current position detector 41C so that a restore operation is performed (step Sr2), and the restore operation can be ended (step Sr3).

As described above, when the current position L is backed up and restored in the nonvolatile memory, each of the opening/closing section control units 40A does not have to retain the current position L, and thus the constitution of the opening/closing section control unit 40A can be simplified.

FIGS. 11(A) to 11(F) are diagrams illustrating comparison between the relative speed Vt outputted from the opening/closing section control unit 40 and a speed measured in a conventional method, FIG. 11(A) illustrates a state where a voltage to be supplied to the motor 15 is normal, and FIG. 11(B) illustrates a state where the voltage to be supplied to the motor 15 is high. FIG. 11(C) illustrates speed measured values obtained by the conventional method when the voltage to be supplied to the motor 15 is low, and FIG. 11(D) illustrates a state where the voltage to be supplied to the motor 15 is normal. FIG. 11(E) illustrates a state where the voltage to be supplied to the motor 14 is high, and FIG. 11(F) illustrates measured values of the relative speed when the voltage to be supplied to the motor 15 is low.

That is to say, in the present invention, the relative speed Vt of tire opening/closing section 3 is obtained based on the output pulse Pa (or may be Pb) from the rotation detecting means 15A and 15R by using the reference pulse Pm generated by converting the fluctuation in the power supply voltage at the position very close to the motor into a relative change in the frequency as a count clock. For example, as shown in the drawing, the count number of the reference pulse Pm counted during one period (or may be a half period) of the output pulse Pa is an inverse number of the relative speed Vt. The count number obtained by using the reference pulse Pm is, as shown in FIG. 11(D) to FIG. 11(F), a constant value of 10 counts even if the rotating speed of the motor 15 changes according to the fluctuation in the power supply voltage. On the other hand, when a clock Clk generated at a constant frequency is used as a standard like the conventional system shown in FIG. 11(A) to FIG. 11(C), the speed fluctuates according to the fluctuation in the power supply voltage. In the present embodiment, the count number is used as the relative speed Vt so that more simplification is proposed.

Therefore, the vehicle body control ECU 40B obtains the relative speed Vt from the count number, and since a change in the rotating speed of the motor 15 caused by the influence of the fluctuation in the power supply voltage can be cancelled, the pinch detection can be accurately made according to the change in the speed based on the relative speed Vt. Further, since the current position L and the moving direction d of the opening/closing section 3 can be received, the pinch detector 46 determines the reduction in the relative speed Vt at the position of the opening/closing section 3 and in the moving direction d where pinch of foreign matters might occur immediately as pinch, and can transmit a control signal C or reversely rotating the motor 15 to the opening/closing section control unit 40A of the opening/closing section 3.

In the opening/closing section control unit 40A that receives the control signal C, when its receiving section 42R receives the control signal C, the unit 40A sends this signal to the drive 16B so as to reversely drive the motor 15. That is to say, since the occurrence of the pinch is immediately detected and the opening/closing section 3 can be moved to the opposite direction, the pinched foreign matter can be safely removed. Further, all the communication between the opening/closing section control unit 40A and the vehicle body control ECU 40B is carried our by digital signals, and thus analog conversion does not have to be carried out. For this reason, the communication is hardly affected by disturbance noises and malfunction can be completely eliminated, and also non-use of the A/D converter can reduce the production cost of the respective opening/closing section control units 40A as much as possible.

Figure 12:
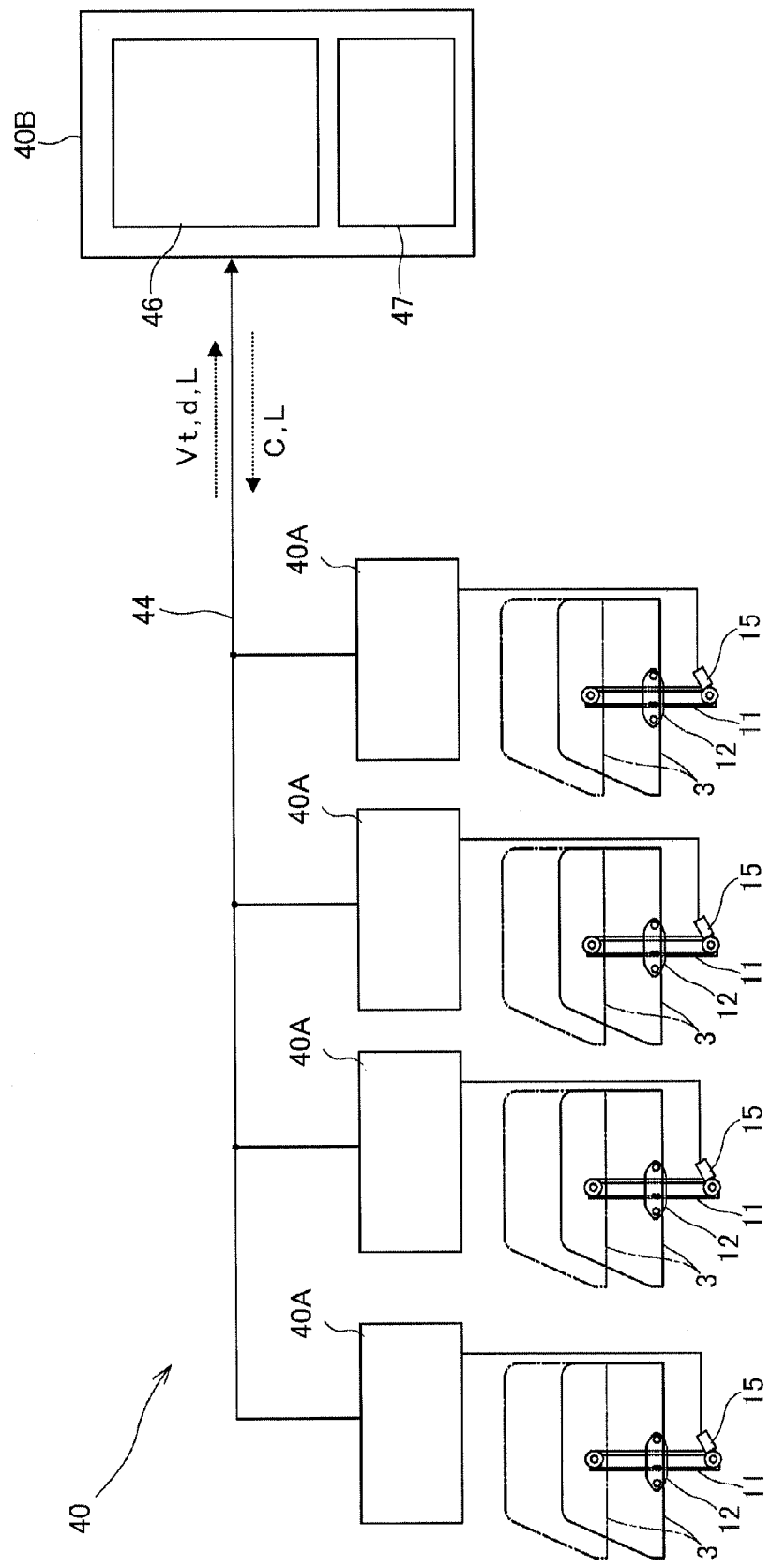
FIG. 12 is a diagram illustrating an entire constitution of the pinch detection device at the opening/closing section.

FIG. 12 is a diagram illustrating an entire constitution of the vehicle 2 having the pinch detection device 40 at the opening/closing section according to the embodiment. As shown in FIG. 12, one vehicle body control ECU 40B is connected to the plurality of the opening/closing section control units 40A, and the opening/closing section control units 40A are connected to the corresponding motors 15 of the opening/closing sections 3, respectively. All signals that are communicated between the opening/closing section control unit 40A and the vehicle body control ECU 40B are the same signals Vt, d, L and C, and the pinch detector 46 uses an information processor (microcomputer) as the arithmetic processing section, so that the same signal processes can be executed by software correspondingly to the respective opening/closing sections 3, thereby reducing the production cost. Similarly, the current positions L of all the opening/closing section 3 may be stored in one nonvolatile memory 47, and thus the constitution can be simplified.

Figure 13:
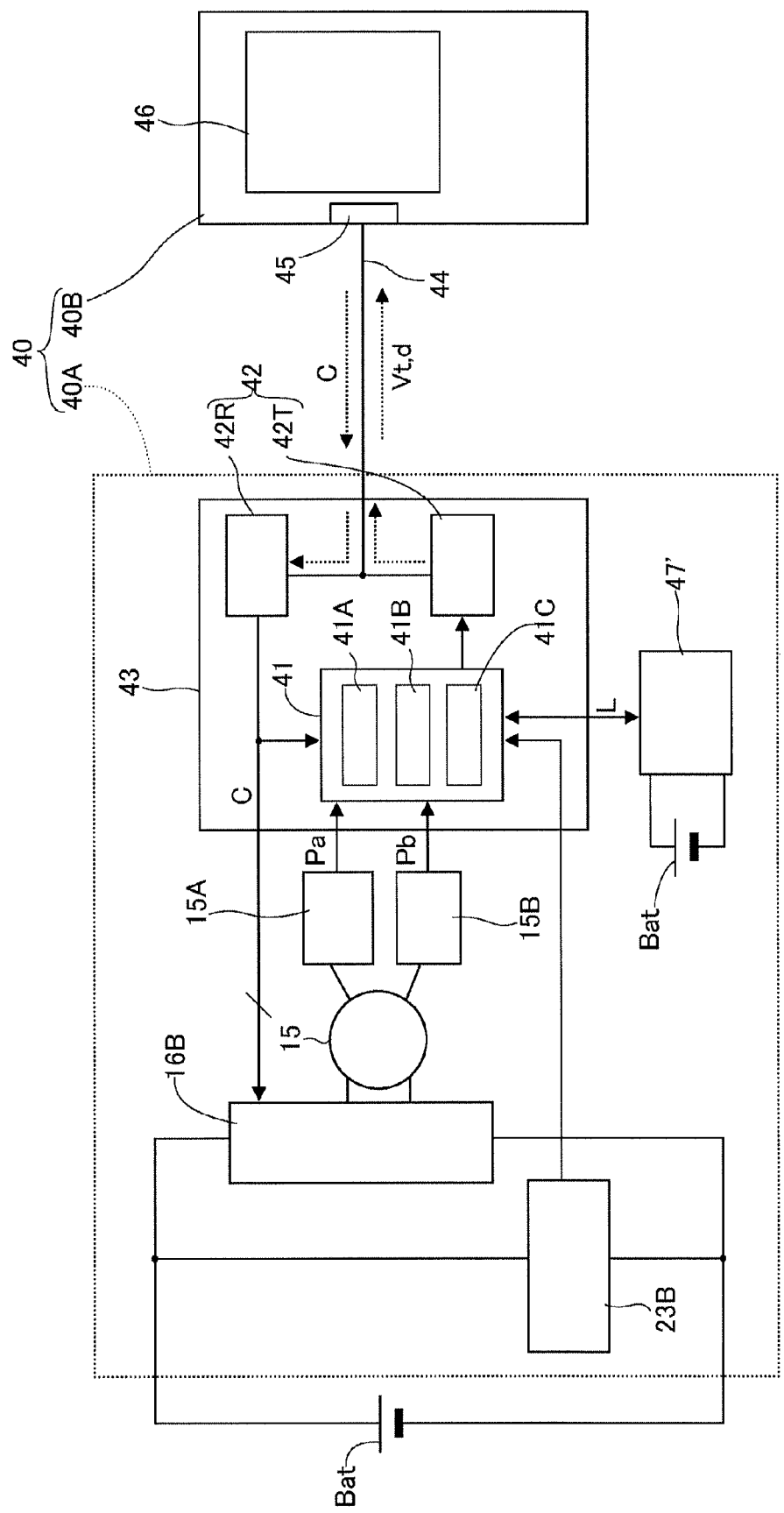
FIG. 13 is a diagram illustrating a modified example of the pinch detection device at the opening/closing section.

FIG. 13 is a diagram illustrating a modified example of the second embodiment. In FIG. 13, a point different from FIG. 9 is that the current position saving section 47' is provided to a side of the opening/closing section control unit 40A, and the current position saving section 47' is used as a memory (namely, a nonvolatile memory) backed up by the battery Bat. Such a constitution of the present modified example can reduce the communication between the opening/closing section control unit 40A and the vehicle body control ECU 40B as much as possible.

As described above, in the pinch detection device at the opening/closing section according to the second embodiment, the sensors are the rotation detecting units 15A and 15B for outputting the pulses Pa and Pb synchronous with the rotation of the motors 15 and the time counter is voltage-frequency converting unit 23B for converting the fluctuation in the power supply voltage at the position very close to the motor 15 into the relative change of the frequency and generating the reference pulse Pm and outputting it, and the sensor-side communication section 42 for calculating the relative speed Vt of the opening/closing section 3 based on the output pulses Pa and Pb of the rotation detecting units 15a and 15b using the reference pulse Pm as a count clock so as to transmit it, and the control-side communication section 45 capable of receiving the relative speed Vt with being connected to the sensor-side communication section 42 via the communication line 44 are provided. Since the pinch detector 46 detects pinch based on the change in the received relative speed Vt, the relative speed Vt at which the voltage fluctuation is corrected and the current position L of the opening/closing section 3 are transmitted from the inexpensive logic IC 43 to the vehicle control ECU 40B so that the pinch detection is controlled on the side of the vehicle body control ECU. As a result, a dedicated microcomputer or an external A/D converter is not required, thereby reducing the cost.

Further, the pinch detector 46 provided to one vehicle body control ECU 40B is connected to the plurality of rotation detecting units 15a and 15b and the voltage-frequency converting unit 23B via the communication line 44. When the pinch detection in the plurality of opening/closing sections 3 is collectively controlled in a concentrated manner, information about the plurality of opening/closing sections 3 of the vehicle 2 is sent from the logic IC 43 having the communication function to the vehicle body control ECU 40B, and the pinch detection in all the opening/closing sections 3 is collectively controlled in the concentrated manner by one vehicle body control ECU 40B. As a result, a dedicated microcomputer for each of the opening/closing sections 3 is not necessary, thereby further reducing the cost.

Furthermore, when the sensor-side communication section 42 and the control-side communication section 45 superpose a signal on the power line 44 and use the power line as the communication line so as to carry out the direct current power line carrier communication, the connection between the vehicle body control ECU 40B and each of the opening/closing section control units 40A is simple. As a result, the production cost can be reduced and also a construction work such as wiring is easy.

In addition, the current position detector 41C for counting the pulses Pa and Pb so as to obtain the current position L of the opening/closing section 3 is provided, and the current position detector 41C transmits the current position L via the sensor-side communication section 42 according to ignition-off. The current position saving section 47 for storing the current position L received via the control-side communication section 45 into the nonvolatile memory is provided, and the position information saving section 47 transmits the current position stored in the nonvolatile memory via the control-side communication section 45 according to ignition on. When the current position detector 41C restores the current position L based on information received via the sensor-side communication section 42, even if power feeding to the opening/closing section control unit 40A is stopped due to ignition-off, since the current position L of the opening/closing section 3 is backed up in the vehicle body control ECU 40B, the stable operation can be performed at a low cost.

In another manner, the opening/closing section control unit 40A is provided with the current position detector 41C for obtaining the current position L of the opening/closing section by counting of the pulses Pa and Pb. When the current position detector 41C backs up the current position L in the nonvolatile memory 47' due to energization at the ignition-off time, electric power is supplied only to the minimum necessary memory 47' in each of the opening/closing section control units 40A so that the current position L can be packed up.

Figure 14:
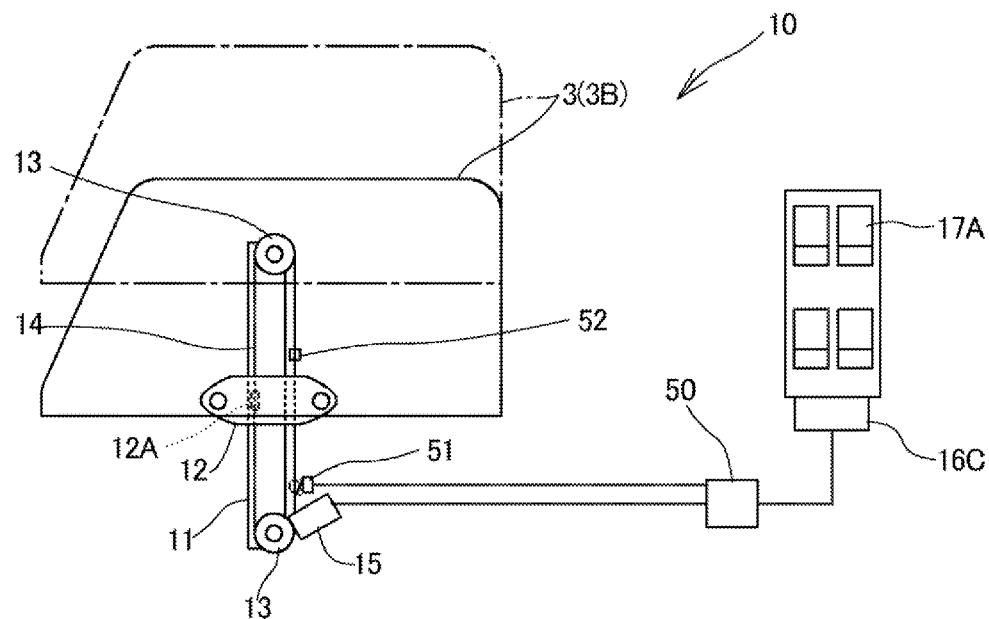
FIG. 14 is a diagram illustrating the opening/closing section control device to which the pinch detection device the opening/closing section according to a third embodiment is mounted.
Figure 15:
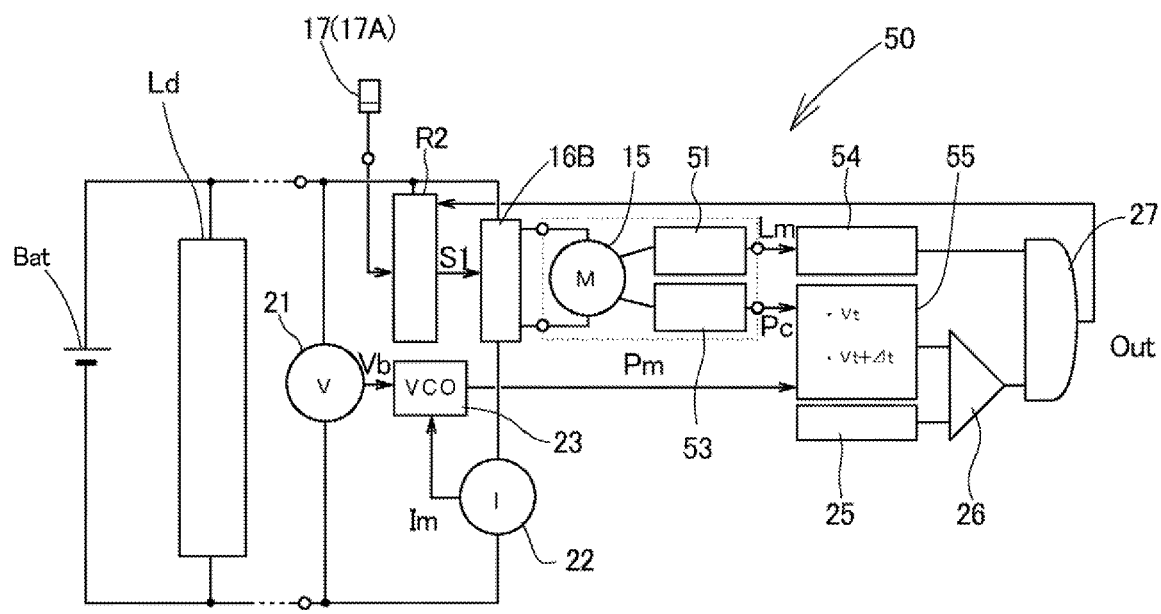
FIG. 15 is a diagram illustrating the pinch detection device at the opening/closing and the pinch detecting method in the opening/closing section.
Figure 16:
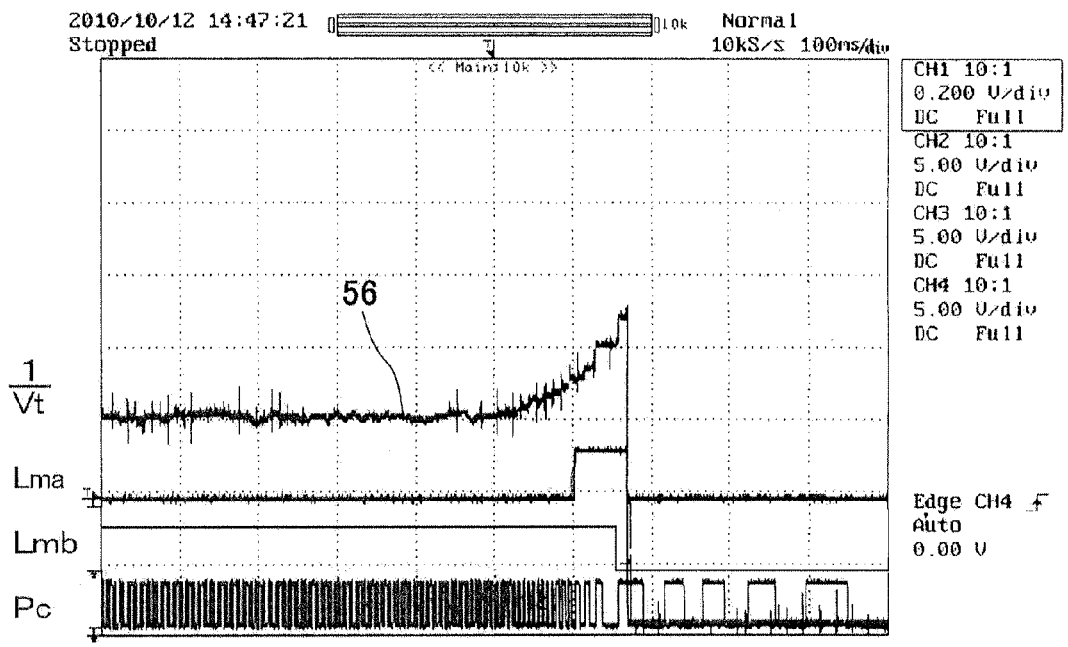
FIG. 16 is a diagram describing a completely closing operation in a state that the power supply voltage is high.
Figure 17:
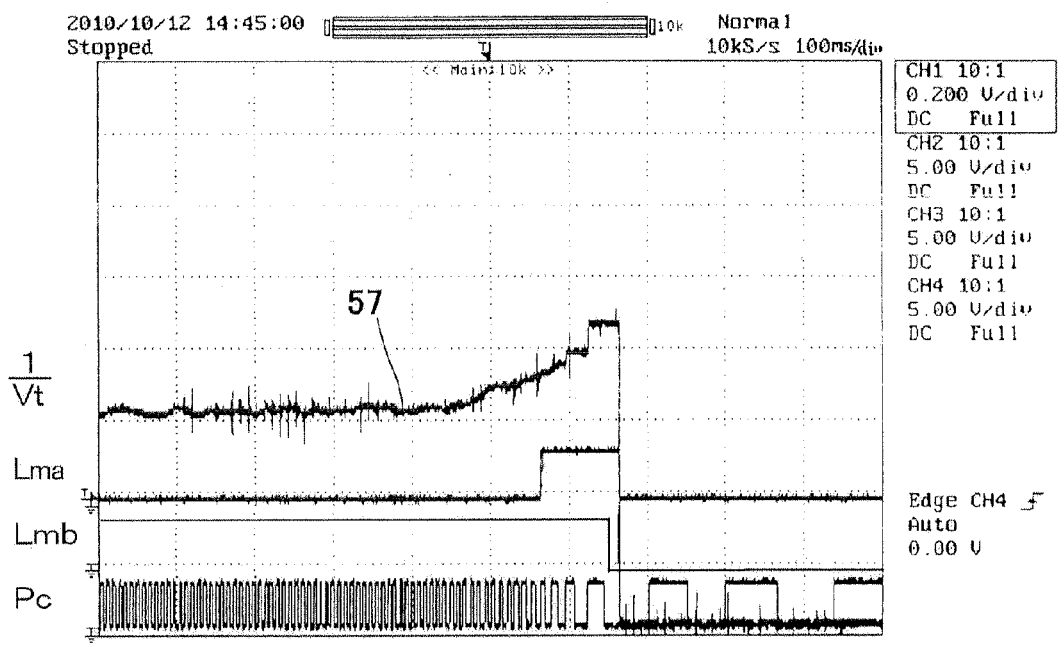
FIG. 17 is a diagram describing a completely closing operation in a state that the power supply voltage is low.

FIG. 14 is a diagram illustrating an example where the pinch detection device 50 at the opening/closing section according to a third embodiment is provided to the power window device 10. FIG. 15 is a diagram illustrating a detailed constitution of the pinch detection device 50 at the opening/closing section. FIGS. 16 and 17 are diagrams describing the operation of the pinch detection device 50 at the opening/closing section. In FIG. 14 to FIG. 17, since members denoted by the same reference numerals as those in FIG. 1 to FIG. 13 are identical or equivalent to each other, detail description thereof is omitted.

In the present embodiment, 16C represents an operation signal output section for outputting an open/close operation signal of the windows 3B according to operation input of the operation switch 17A, and 51 represents a closed position detecting switch (limit switch) for detecting the closed state of the windows 3B using an abutting section 52 provided to the wire 14 and outputting a limit signal Lm of a 2-bit gray code. 53 represents an encoder for outputting a one-phase pulse Pc that is provided to the motor 15, and 54 represents a reference point position detector for detecting a reference point position using the limit signal Lm. 55 represents a relative acceleration calculator for obtaining the relative speed Vt of the windows 3B based on the pulse Pc and the reference pulse Pm. Further, the relative acceleration calculator 55 determines a direction based on the pulse Pc and polarity of a voltage to be supplies to the motor 15 so as to calculate the current position based on the count number of the reference pulse Pm.

Since the pinch detection device 50 at the opening/closing having the above constitution can detect the closed state of the windows 3B or its vicinity through the closed position detecting switch 51, when the windows 3B are in the vicinity of the closed state, the pinch detection is not made, and only when the current position of the windows 3B is not near the reference position, the pinch detection can be made. When the closed position detecting switch 51 outputs the limit signal Lm with 2-bit gray code, disconnection can be also detected so that a position of an original point can be detected more surely. However, the closed position detecting switch 51 may be an analog potentiometer.

Further, since the pinch detection device 50 at the opening/closing section according to the present embodiment can determine that the windows 3B are in the closed position or in the vicinity of it through the closed position detecting switch 51, the pinch detection device 50 at the opening/closing section does not have to input the position of the windows 3B from a higher information processor so as to execute the local process.

FIG. 16 is a diagram illustrating an example of signals of the respective sections at a time when the opening/closing section 3b is closed in the case where the power supply voltage Vb is 15 V and the motor 15 rotates at a high speed. FIG. 17 is a diagram illustrating an example in the case where the power supply voltage Vb is 10 V. In FIGS. 16 and 17, graphs shown by symbols 56 and 57 are values obtained by counting the number of the reference pulse Pm indication the relative time during one period of the pulse Pc, and Lma and Lmb represent 2-bit limit signals Lm. In a state that the windows 3B are the closed or in the vicinity of the closed position due to the limit signal Lm, the pinch detection is not made so that the windows 3B can be completely closed. In the fully closed state, the closed position detecting switch 41 may detect a closed end of the windows 3B.

Figure 18:
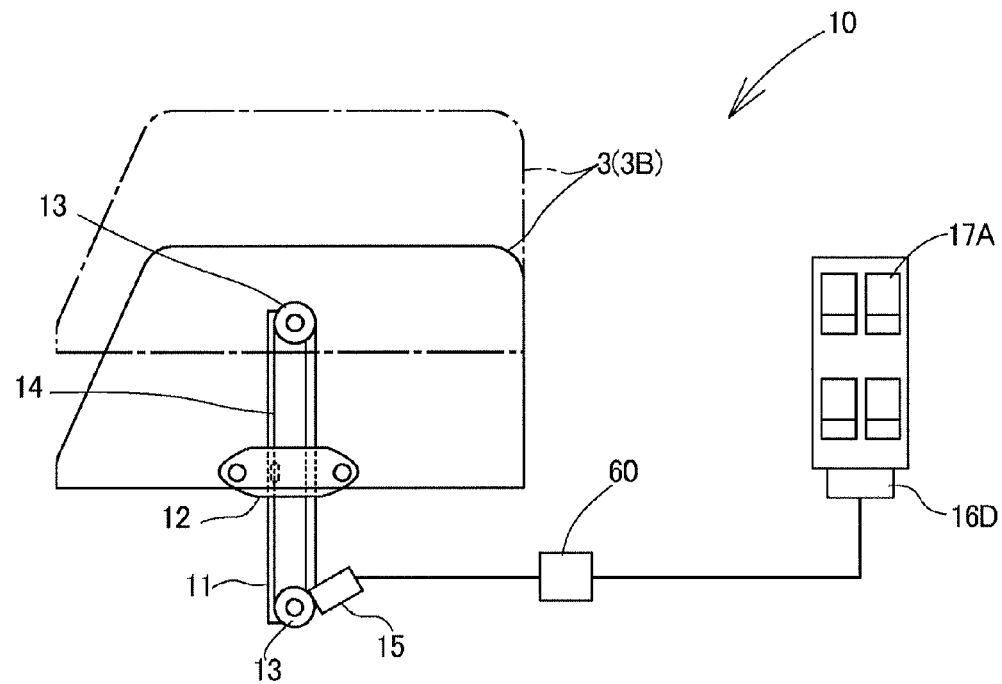
FIG. 18 is a diagram illustrating the opening/closing section control device to which the pinch detection device at the opening/closing section according to a fourth embodiment is mounted.
Figure 19:
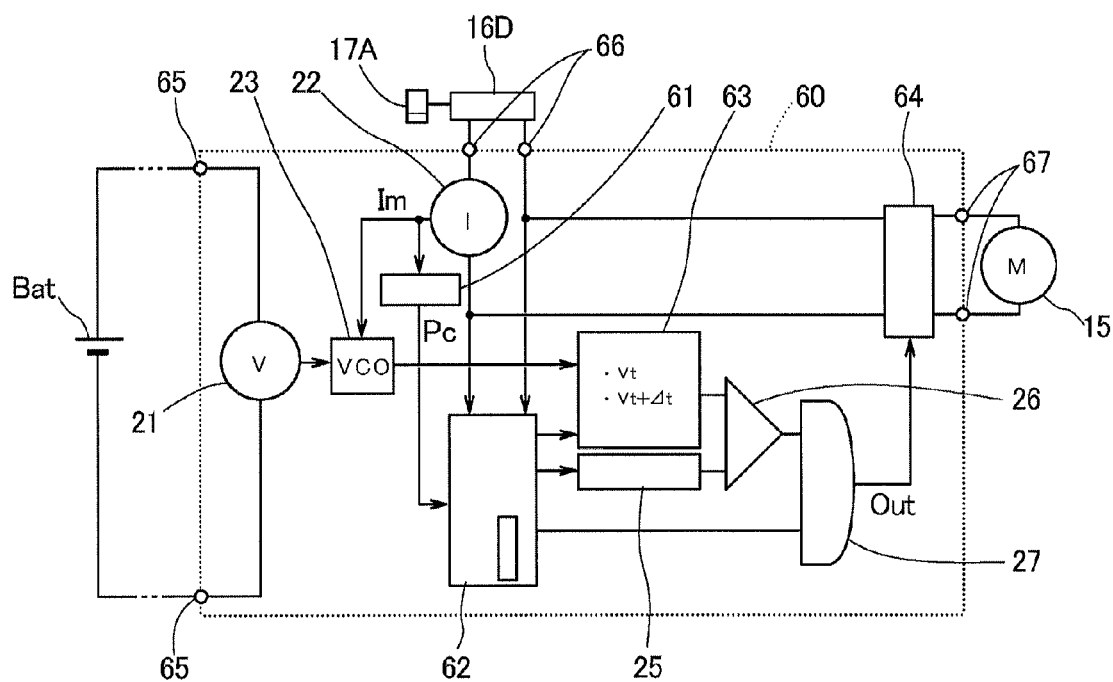
FIG. 19 is a diagram illustrating the constitution of the pinch detection device at the opening/closing section.
Figure 20:
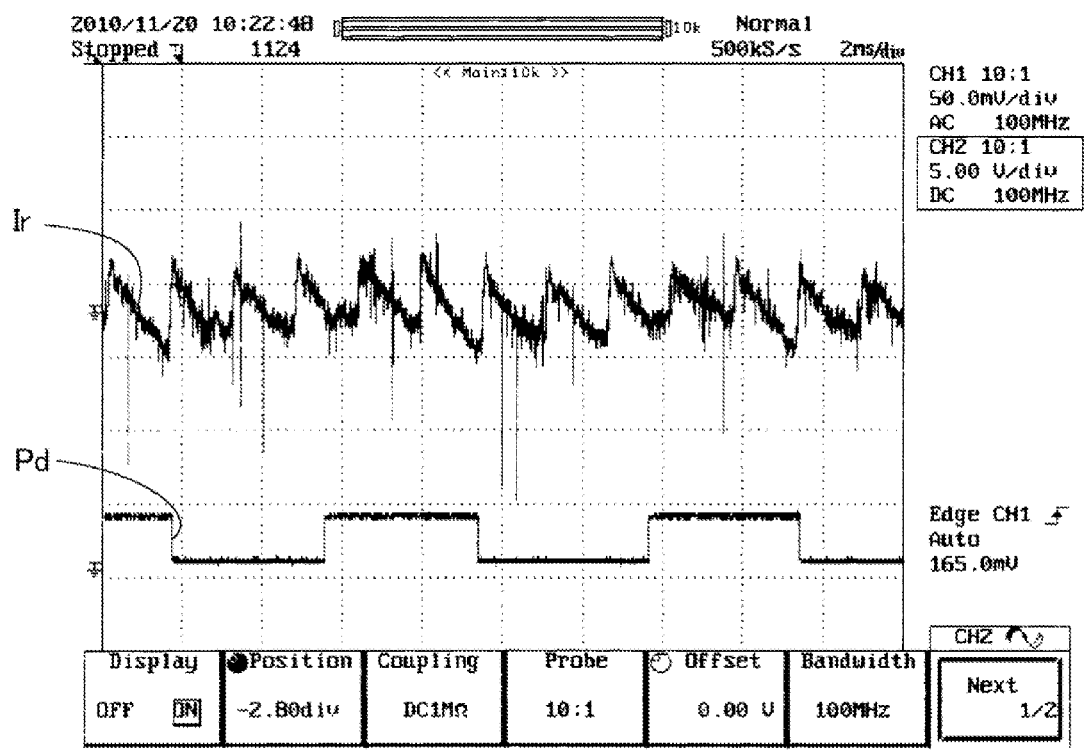
FIG. 20 is a diagram illustrating an example of a signal process of the pinch detection device at the opening/closing section.
Figure 21:
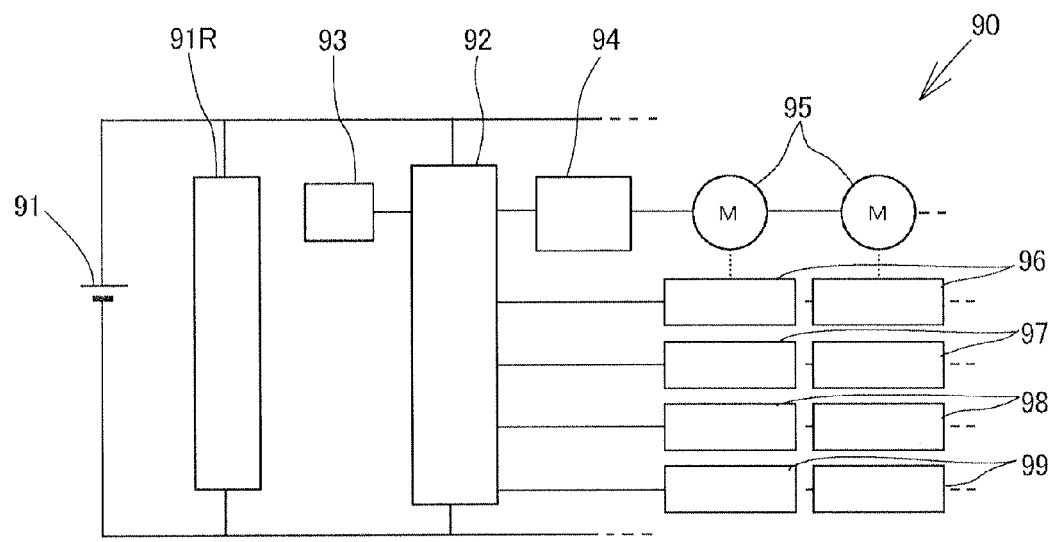
FIG. 21 is a diagram describing a constitution of a conventional power window device.

FIG. 18 is a diagram illustrating an example where the pinch detection device 60 at the opening/closing section according to a fourth embodiment is provided to the power window device 10. FIG. 19 is a diagram illustrating a detailed constitution of the pinch detection device 60 at the opening/closing section. FIG. 20 is a diagram illustrating a ripple generated in an electric current Ir flowing in the motor 15 due to the rotation of the motor 15. In FIG. 18 to FIG. 20, since members that are identical or equivalent to those in FIG. 1 to FIG. 17, detailed description thereof is omitted.

In the present embodiment, 16D represents a motor drive circuit for supplying an electric power Pw for driving the motor 15 according to an operation input of the operation switch 17A, and 61 represents a signal processing circuit including a filter circuit that is connected to the motor drive circuit 16D and extracts the ripple generated in the electric current Im flowing in the motor 15 so as to generate the pulse Pc equivalent to that of the pulse encoder according to the rotation angle of the motor 15. 62 represents a direction/position detecting circuit for checking the polarity of the electric power Pw based on the output from the motor drive circuit 16D to check the rotating direction of the motor 15 and counting the output pulse Pc of the signal processing circuit 61 so as to calculate the current position L of the window 3B. 63 represents a relative acceleration calculator 63 for calculating the relative acceleration using the reference pulse Pm and the current position L. 64 represents a reverse controller for reversely rotating the motor 15 for predetermined time at a time when the pinch detection is made so as to move the window 3B to the opened direction.

Further, 65 represents a power source connecting section to be connected to the power supply, 66 represents a switch connecting section to be connected to the motor drive circuit 16D, and 67 represents a motor connecting section for connecting the motor 15. That is to say, the pinch detecting device 60 for the window according to the present embodiment is unitized by the connecting sections 65 to 67 so as to be put between the operation a switch 17A and the motor 15, thereby enabling the pinch detection as to also the existing windows 3B. Since the motor 15 does not require the pulse encoder, the pinch detection device 60 at the opening/closing section can be easily mounted to existing vehicles.

INDUSTRIAL APPLICABILITY

In the pinch detection device at the opening/closing section according to the present invention, the vehicle having the device, and the pinch detecting method in the opening/closing section, the fluctuation in the motor rotating speed due to voltage fluctuation is cancelled, the pinch detection can be made based on a change amount of the rotating speed of the motor. For this reason, the pinch detection can be surely made by the very simple circuit configuration and/or the software process without mis-detecting a change in the rotating speed of the motor caused by the voltage fluctuation as pinch of foreign matters. For this reason, the device is used in the opening/closing section such as the window, the slide door and roof window in the vehicle.

DESCRIPTION OF SYMBOLS 1, 40, 50, 60 pinch detection device at opening/closing section
2 vehicle
3 opening/closing section
3A slide door
3B window
3C roof window
10 power window device (opening/closing section control unit)
15 motor
15A sensor (encoder)
16 opening/closing section control unit
17 operation switch
22 adjusting circuit
23 conditioning circuit
51 closed position detecting switch
61 signal processing circuit
65 power source connecting section
67 motor connecting section
Vb power supply voltage
T1, T2 relative time

The invention claimed is:

1. A pinch detection device at an opening/closing section, the pinch detection device comprising:
a sensor for detecting displacement of the opening/closing section of a vehicle, the opening/closing section being opened/closed by a motor;
a time counter for counting a relative time on a time axis adjusted according to a fluctuation in a power supply voltage; and
a pinch detector for detecting pinch of a foreign matter at the opening/closing section based on a change in a relative speed obtained from a change in the displacement on a basis of the relative time,
wherein the sensor is a pulse generator for generating a one-phase pulse based on a rotation of the motor and has a closed position detecting switch to detect a closed state and its vicinity of the opening/closing section, and the pinch detector detects the pinch when a current position of the opening/closing section is not near a reference position, and
wherein the pulse generator is a signal processing circuit for extracting a ripple generated in a voltage or an electric current fed to the motor so as to generate a pulse equivalent to a pulse encoder according to a rotation angle of the motor.

2. The pinch detection device at the opening/closing section according to claim 1, wherein the pinch detector has a conditioning circuit for measuring a level of an electric current flowing in the motor so as to finely adjust the relative time according to a level of the electric current.

3. The pinch detection device at the opening/closing section according to claim 1, wherein the pinch detector is a unit including a power source connecting section, which measures a voltage of a circuit power supply, and a motor connecting section, and the unit is interposed between an opening/closing operation switch of the opening/closing section and the motor.

4. A vehicle having an opening/closing section control device mounted with the pinch detection device according to claim 1, the control device detecting the pinch at a time of closing the opening/closing section, and when detecting the pinch, slightly opening the opening/closing section.

5. A pinch detection device at an opening/closing section, the pinch detection device comprising:
a sensor for detecting displacement of the opening/closing section of a vehicle, the opening/closing section being opened/closed by a motor;
a time counter for counting a relative time adjusted according to a fluctuation in a power supply voltage; and
a pinch detector for detecting a pinch of a foreign matter at the opening/closing section based on a change in a relative speed obtained from a change in the displacement on a basis of the relative time,
wherein the time counter is a voltage controlled oscillator for transmitting a reference pulse with a frequency reduced according to a reduction in the power supply voltage, and the pinch detector detects the pinch when an inverse number of a counted value of the reference pulse counted while the sensor is detecting a minute displacement of the opening/closing section as the relative speed of the opening/closing section meets or exceeds a threshold.

6. A pinch detecting method for detecting a pinch at an opening/closing section of a vehicle opened/closed by rotation of a motor, the pinch detecting method comprising:

detecting a displacement according to movement of the opening/closing section;

obtaining a change in a relative speed based on the displacement using a relative time adjusted so as to be long according to a power supply voltage through a calculator as a measure; and comparing the change in the relative speed with an acceleration threshold so as to detect pinch of a foreign matter, wherein an oscillation signal with low frequency is generated according to a reduction in the power supply voltage by a voltage controlled oscillator, a relative time is counted at a period of the oscillation signal, and a relative acceleration is obtained based on an inverse number of a number of the oscillation signal counted while the opening/closing section is shifting due to a predetermined minute displacement.

7. The pinch detecting method for the opening/closing section according to claim 6, wherein the relative time is finely adjusted so as to be long according to an increase in an electric current flowing in the motor.

8. The pinch detecting method for the opening/closing section according to claim 6, wherein a closed state of the opening/closing section is detected by a closed position detecting switch that outputs a gray code, a position of the opening/closing section is adjusted to a reference position by the detection of the closed position, a current position of the opening/closing section is calculated by a direction determination based on the polarity of a voltage fed to the motor and a count number of pulses generated according to rotation of a decoder provided to the motor, and only when the current position is not in a vicinity of the reference position, the pinch detection is made.

* * * * *